(12) United States Patent
Jun et al.

(10) Patent No.: US 12,069,941 B2
(45) Date of Patent: Aug. 20, 2024

(54) ORGANIC ELECTROLUMINESCENCE DEVICE AND POLYCYCLIC COMPOUND FOR ORGANIC ELECTROLUMINESCENCE DEVICE

(71) Applicants: Samsung Display Co., Ltd., Yongin-si (KR); INDUSTRY-ACADEMIC COOPERATION FOUNDATION GYEONGSANG NATIONAL UNIVERSITY, Jinju-si (KR)

(72) Inventors: Mi Eun Jun, Hwaseong-si (KR); Hyein Jeong, Suwon-si (KR); Soon-Ki Kwon, Jinju-si (KR); Yun-Hi Kim, Jinju-si (KR); Youheon Kim, Changwon-si (KR)

(73) Assignees: Samsung Display Co., Ltd., Yongin-si (KR); Industry-Academic Cooperation Foundation Gyeongsang National University, Jinju-si (KR)

( * ) Notice: Subject to any disclaimer, the term of this patent is extended or adjusted under 35 U.S.C. 154(b) by 642 days.

(21) Appl. No.: 17/308,280

(22) Filed: May 5, 2021

(65) Prior Publication Data
US 2022/0029113 A1 Jan. 27, 2022

(30) Foreign Application Priority Data
Jul. 27, 2020 (KR) .................. 10-2020-0093323

(51) Int. Cl.
*C07F 7/08* (2006.01)
*H10K 85/40* (2023.01)
(Continued)

(52) U.S. Cl.
CPC .......... *H10K 85/40* (2023.02); *H10K 85/631* (2023.02); *H10K 85/654* (2023.02);
(Continued)

(58) Field of Classification Search
None
See application file for complete search history.

(56) References Cited

U.S. PATENT DOCUMENTS

| 8,227,798 B2 | 7/2012 | Kai et al. |
| 2007/0103060 A1* | 5/2007 | Itoh ...................... H10K 85/346 313/504 |

(Continued)

FOREIGN PATENT DOCUMENTS

| CN | 105884810 A * | 8/2016 | ................ C07F 7/10 |
| CN | 106432317 A * | 2/2017 | ................ C07F 7/10 |

(Continued)

OTHER PUBLICATIONS

Machine translation of CN-105884810-A, translation generated Nov. 2023, 9 pages. (Year: 2023).*

(Continued)

*Primary Examiner* — Robert S Loewe
(74) *Attorney, Agent, or Firm* — Lewis Roca Rothgerber Christie LLP

(57) ABSTRACT

Provided is an organic electroluminescence device including a first electrode, an organic layer on the first electrode, and a second electrode on the organic layer, wherein the organic layer includes a polycyclic compound represented by Formula 1. The organic electroluminescence device including a polycyclic compound represented by Formula 1 thereby exhibits high luminous efficiency.

16 Claims, 3 Drawing Sheets

(51) Int. Cl.
*H10K 85/60* (2023.01)
*H10K 50/15* (2023.01)
*H10K 50/16* (2023.01)

(52) U.S. Cl.
CPC ......... *H10K 85/6572* (2023.02); *H10K 50/15* (2023.02); *H10K 50/16* (2023.02)

(56) References Cited

U.S. PATENT DOCUMENTS

2018/0145268 A1* 5/2018 Ma .................. C09K 11/025
2022/0384733 A1* 12/2022 Choi ................ H10K 85/322

FOREIGN PATENT DOCUMENTS

| JP | 4144987 B2 | 9/2008 |
| KR | 10-2011-0049244 A | 5/2011 |
| KR | 10-1474232 B1 | 12/2014 |

OTHER PUBLICATIONS

Machine translation of CN-106432317-A, translation generated Nov. 2023, 8 pages. (Year: 2023).*
Antonio de la Hoz, et al., "Solvent-free preparation of tris-pyrazolyl-1,3,5-triazines," Tetrahedron, No. 57, (2001), pp. 4397-4403.

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0093323, filed on Jul. 27, 2020, the entire contents of which are hereby incorporated by reference.

BACKGROUND

1. Field

Embodiments of the present disclosure herein relate to an organic electroluminescence device and a polycyclic compound for the organic electroluminescence device.

2. Description of the Related Art

Recently, the development of an organic electroluminescence display as an image display device is being actively conducted. Unlike liquid crystal display devices and the like, the organic electroluminescence display is a so-called self-luminescent display device in which holes and electrons injected from a first electrode and a second electrode, respectively, recombine in an emission layer, and thus a luminescent material including an organic compound in the emission layer emits light to implement a display.

In the application of an organic electroluminescence device to a display device, there is a demand for an organic electroluminescence device having a low driving voltage, high luminous efficiency, and/or a long service life, and the development of materials, for an organic electroluminescence device, capable of stably attaining such characteristics is being continuously required.

In recent years, in order to implement a highly efficient organic electroluminescence device, technologies pertaining to phosphorescence emission using triplet state energy or delayed fluorescence using triplet-triplet annihilation (TTA) in which singlet excitons are generated by collision of triplet excitons are being developed, and thermally activated delayed fluorescence (TADF) materials using delayed fluorescence phenomenon are being developed.

SUMMARY

Embodiments of the present disclosure herein provide an organic electroluminescence device having a long service life and/or high efficiency, and a polycyclic compound used therein.

Embodiments of the present disclosure herein also provide an organic electroluminescence device including a thermally activated delayed fluorescence emitting material and a polycyclic compound used as a thermally activated delayed fluorescence emitting material.

An embodiment of the present disclosure provides a polycyclic compound represented by Formula 1 below:

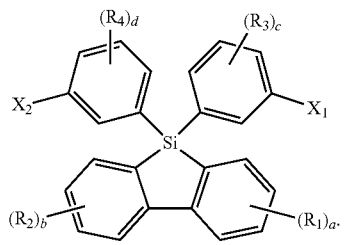

Formula 1

In Formula 1 above, $X_1$ and $X_2$ are each independently a substituted or unsubstituted amine group, an aryl group having 6 to 30 ring-forming carbon atoms and having at least one amine group as a substituent, or a substituted or unsubstituted heteroaryl group having 2 to 30 ring-forming carbon atoms and including at least one N, $R_1$ to $R_4$ are each independently a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and a to d are each independently an integer of 0 to 4.

In an embodiment, $X_1$ and $X_2$ above may be each independently represented by Formula 2 below:

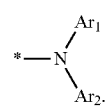

Formula 2

In Formula 2 above, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, or are bonded to each other to form a ring.

Formula 2 above may be represented by Formula 2-1 or Formula 2-2 below:

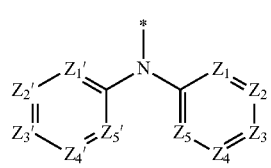

Formula 2-1

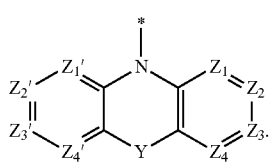

Formula 2-2

In Formula 2-1 and Formula 2-2 above, Y is a direct linkage, $CR_{10}R_{11}$, O, S, $SiR_{12}R_{13}$, or $GeR_{14}R_{15}$, $R_{10}$ to $R_{15}$ are each independently a hydrogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $Z_1$ to $Z_5$ and $Z_1'$ to $Z_5'$ are each independently N or $CR_8$, and $R_8$ is a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, $X_1$ and $X_2$ above may be each independently represented by Formula 3 below:

Formula 3

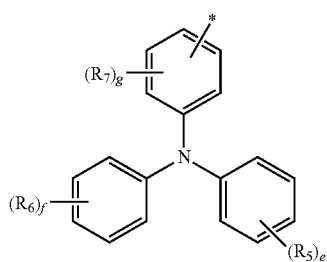

In Formula 3 above, $R_5$ to $R_7$ are each independently a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to each other to form a ring, e and f are each independently an integer of 0 to 5, and g is an integer of 0 to 4.

Formula 3 above may be represented by Formula 3-1 or Formula 3-2 below:

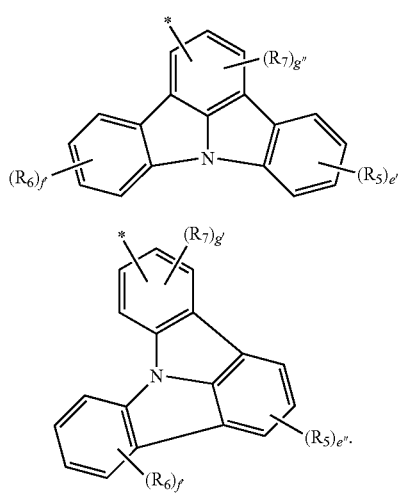

In Formula 3-1 and Formula 3-2 above, e' and f' are each independently an integer of 0 to 4, e" and g' are each independently an integer of 0 to 3, g" is an integer of 0 to 2, and $R_5$ to $R_7$ are the same as defined in Formula 3.

In an embodiment, Formula 1 above may be represented by Formula 4-1 or Formula 4-2 below:

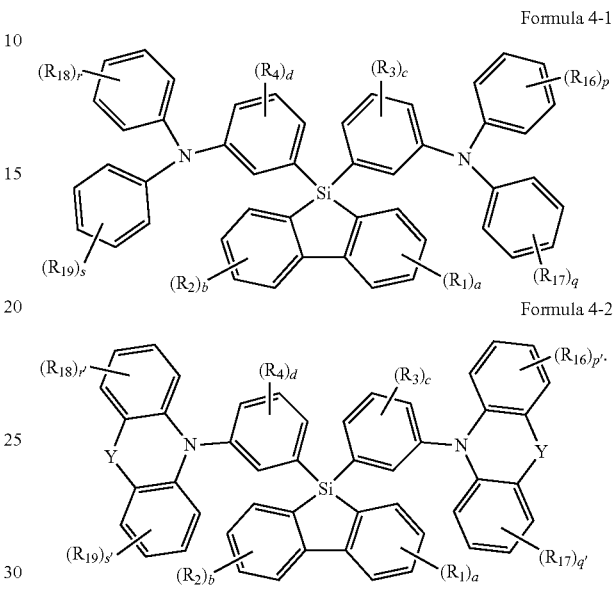

In Formula 4-1 and Formula 4-2 above, Y is a direct linkage, $CR_{10}R_{11}$, O, S, $SiR_{12}R_{13}$, or $GeR_{14}R_{15}$, $R_{16}$ to $R_{19}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, p to s are each independently an integer of 0 to 5, p' to s' are each independently an integer of 0 to 4, and $R_1$ to $R_4$ and a to d are the same as defined in Formula 1.

In an embodiment, the compound represented by Formula 1 above may be any one selected from among the compounds represented by Compound Group 1.

In an embodiment of the present disclosure, an organic electroluminescence device includes: a first electrode; an organic layer on the first electrode; and a second electrode on the organic layer, wherein the organic layer includes a polycyclic compound represented by Formula 1 above.

In an embodiment, the organic layer may include a hole transport region on the first electrode, an emission layer on the hole transport region, and an electron transport region on the emission layer, wherein the polycyclic compound may be included in at least one layer selected from the hole transport region, the emission layer, and the electron transport region.

In an embodiment, the emission layer may include a first compound and a second compound, wherein the first compound may be the polycyclic compound.

In an embodiment, the emission layer may be a delayed fluorescence emission layer which emits blue light.

In an embodiment, the emission layer may be a phosphorescence emission layer which emits blue light.

In an embodiment, the electron transport region may include an electron transport layer on the emission layer and an electron injection layer on the electron transport layer, and the electron transport layer and/or the electron injection layer may include the polycyclic compound.

In an embodiment, the hole transport region may include a hole injection layer on the first electrode and a hole transport layer on the hole injection layer, and the hole injection layer and/or the hole transport layer may include the polycyclic compound.

BRIEF DESCRIPTION OF THE DRAWINGS

The accompanying drawings are included to provide a further understanding of the subject matter of the present disclosure, and are incorporated in and constitute a part of this specification. The drawings illustrate embodiments of the present disclosure and, together with the description, serve to explain principles of the subject matter of the present disclosure. In the drawings.

DETAILED DESCRIPTION

Figure 1:
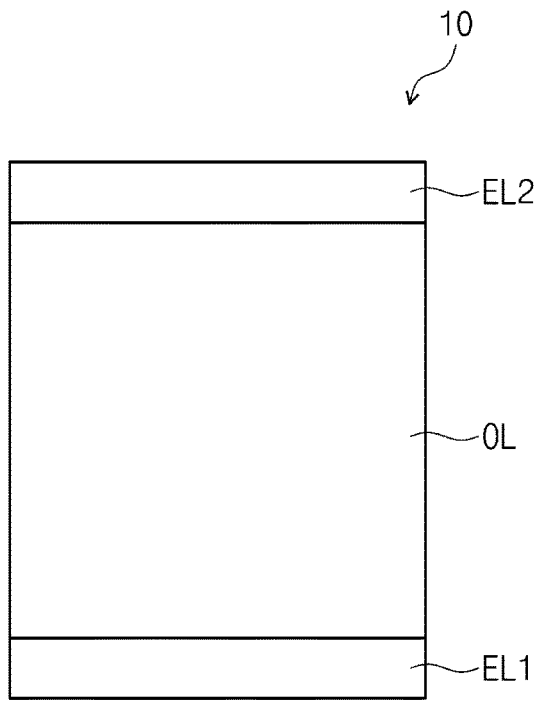
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompanying drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

In the present description, when an element (or a region, a layer, a portion, etc.) is referred to as being "on," "connected to," or "coupled to" another element, it means that the element may be directly on/connected to/coupled to the other element, or that a third element may be therebetween.

Like reference numerals refer to like elements throughout. Also, in the drawings, the thickness, the ratio, and the dimensions of elements may be exaggerated for an effective description of technical features.

The term "and/or" includes all combinations of one or more of which associated configurations may define.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise" or "have" are intended to specify the presence of stated features, integers, active acts, operations, elements, components, or combinations thereof in the disclosure, but do not preclude the presence or addition of one or more other features, integers, active acts, operations, elements, components, or combinations thereof.

Hereinafter, an organic electroluminescence device according to an embodiment of the present disclosure and a compound of an embodiment included therein will be described with reference to the accompanying drawings.

FIGS. 1 to 5 are cross-sectional views schematically illustrating organic electroluminescence devices according to embodiments of the present disclosure. Referring to FIGS. 1 to 5, in each of organic electroluminescence devices 10 according to embodiments, a first electrode EL1 and a second electrode EL2 face each other and an organic layer OL may be between the first electrode EL1 and the second electrode EL2.

Referring to FIGS. 2 to 5, the organic layer OL of an embodiment may include a plurality of functional layers. The plurality of functional layers may include a hole transport region HTR, an emission layer EML, and/or an electron transport region ETR. For example, each of the organic electroluminescence devices 10 according to embodiments may include the first electrode EL1, the hole transport region HTR, the emission layer EML, the electron transport region ETR, and the second electrode EL2 that are sequentially stacked. In addition, the organic electroluminescence device 10 of an embodiment may include a capping layer CPL on the second electrode EL2.

The organic electroluminescence device 10 of an embodiment includes a polycyclic compound of an embodiment, which will be further described herein below, in the organic layer EL between the first electrode EL1 and the second electrode EL2. When the organic layer OL includes the emission layer EML, the emission layer EML may include the polycyclic compound of an embodiment. In another embodiment, the organic electroluminescence device 10 may include the polycyclic compound according to an embodiment, which will be further described herein below, in the hole transport region HTR and/or the electron transport region ETR which is one of the plurality of functional layers between the first electrode EL1 and the second electrode EL2, as well as in the emission layer EML. In some embodiments, the organic electroluminescence device 10 may include the polycyclic compound according to an embodiment, which will be further described herein below, in the capping layer CPL on the second electrode EL2.

Figure 2:
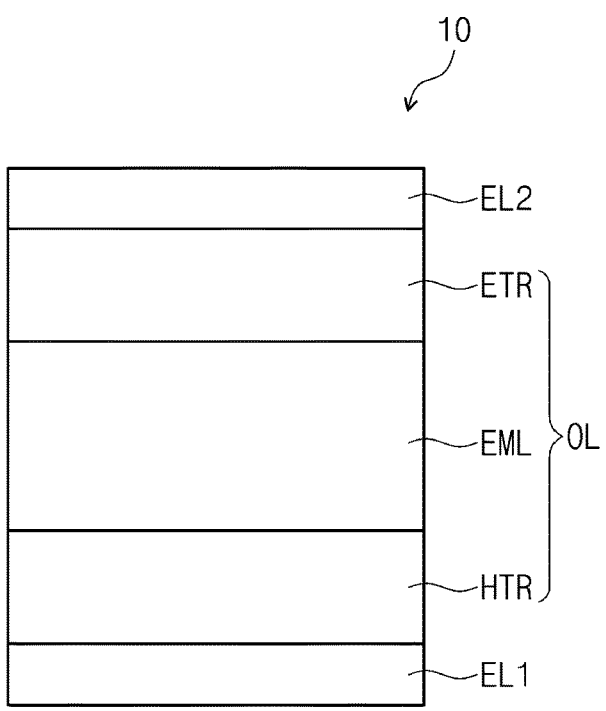
FIG. 2 is a cross-sectional view schematically illustrating an organic electroluminescence device according to an embodiment of the present disclosure.
Figure 3:
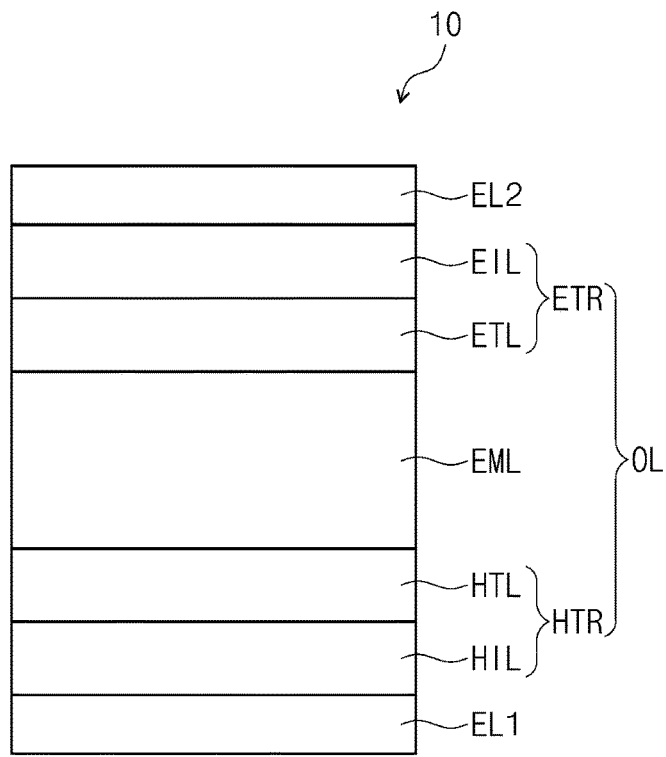
FIG. 3 is a cross-sectional view schematically illustrating an organic electroluminescence device according to an embodiment of the present disclosure.

When compared with FIG. 2, FIG. 3 shows a cross-sectional view of the organic electroluminescence device 10 of an embodiment, wherein the hole transfer region HTR includes a hole injection layer HIL and a hole transport layer HTL, and the electron transfer region ETR includes an electron injection layer EIL and an electron transport layer ETL. In an embodiment, the hole injection layer HIL and/or the hole transport layer HTL may include the polycyclic compound according to an embodiment which will be further described herein below. In another embodiment, the electron injection layer EIL and/or the electron transport layer ETL may include the polycyclic compound according to an embodiment which will be further described herein below.

Figure 4:
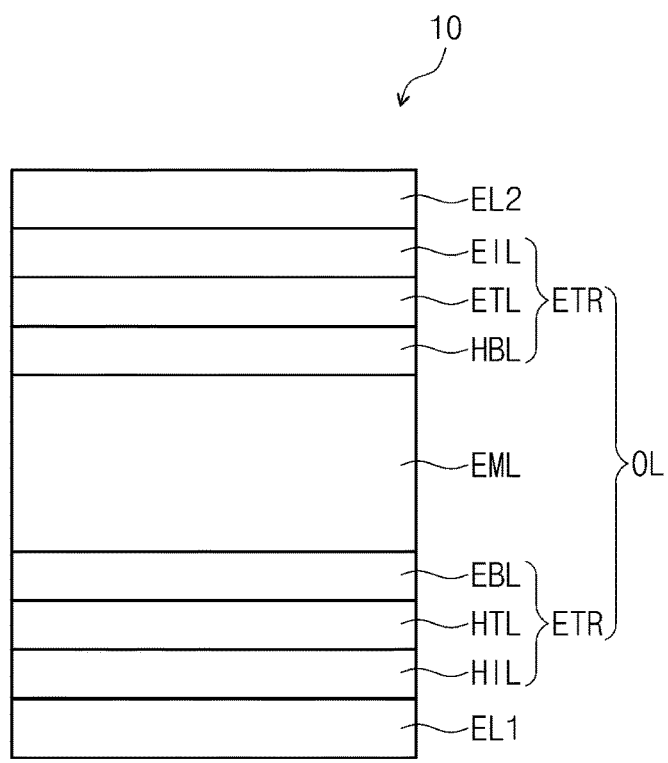
FIG. 4 is a cross-sectional view schematically illustrating an organic electroluminescence device according to an embodiment of the present disclosure.
Figure 5:
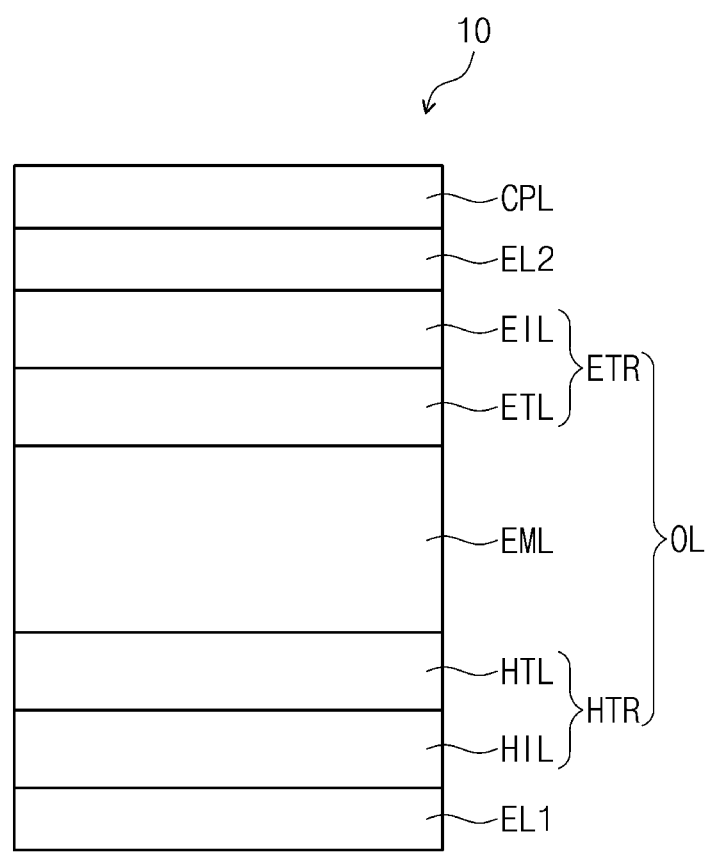
FIG. 5 is a cross-sectional view schematically illustrating an organic electroluminescence device according to an embodiment of the present disclosure.

In addition, when compared with FIG. 2, FIG. 4 illustrates a cross-sectional view of the organic electroluminescence device 10 of an embodiment, wherein the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. When compared with FIG. 3, FIG. 5 illustrates a cross-sectional view of the organic electroluminescence device 10 of an embodiment including a capping layer CPL on the second electrode EL2.

The first electrode EL1 has conductivity (e.g., electrical conductivity). The first electrode EL1 may be formed of a metal alloy and/or a conductive compound. The first electrode EL1 may be a pixel electrode or positive electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In some embodiments, the first electrode EL1 may have a multilayer structure including a reflective layer or a transflective layer formed of the above-described materials, and a transparent conductive layer formed of ITO, IZO, ZnO, ITZO, etc. For example, the first electrode EL1 may have a three-layer structure of ITO/Ag/ITO, but embodiments of the present disclosure are not limited thereto. The thickness of the first electrode EL1 may be in a range from about 1,000 Å to about 10,000 Å, for example, or from about 1,000 Å to about 3,000 Å.

The organic layer EL is on the first electrode EL1. The organic layer EL may have a single layer formed of a single material, a single layer formed of a plurality of different materials, or a multilayer structure having a plurality of layers formed of a plurality of different materials. For example, the organic layer EL may have a single layer structure of the emission layer EML, and may have a multilayer structure formed of the hole transport region HTR, the emission layer EML, and the electron transport region ETR, but embodiments of the present disclosure are not limited thereto.

The organic layer EL of the organic electroluminescence device 10 of an embodiment includes the polycyclic compound according to an embodiment of the present disclosure. When the organic layer OL is a multilayer structure having a plurality of layers, any one layer of the plurality of layers may include the polycyclic compound according to an embodiment. For example, the organic layer OL may include the hole transport region HTR on the first electrode EL1, the emission layer EML on the hole transport region HTR, and the electron transport region ETR on the emission layer EML, and at least one layer selected from the hole transport region HTR, the emission layer EML, and the electron transport region ETR may include the polycyclic compound according to an embodiment of the present disclosure.

In the present description, the term "substituted or unsubstituted" may indicate that one is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents described above may be substituted or unsubstituted. For example, a biphenyl group may be interpreted as an aryl group or a phenyl group substituted with a phenyl group.

In the present description, the term "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The rings formed by being bonded to an adjacent group may be monocyclic or polycyclic. In addition, the rings formed by being bonded to each other may be connected to another ring to form a spiro structure.

In the present description, the term "an adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other.

In the present description, examples of the halogen atom may include a fluorine atom, a chlorine atom, a bromine atom, and an iodine atom.

In the present description, the alkyl group may be a linear, branched or cyclic type (e.g., may be a linear alkyl group, a branched alkyl group, or a cyclic alkyl group). The number of carbons in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

In the present description, the term "alkenyl group" means a hydrocarbon group including at least one carbon double bond at a main chain (e.g., in the middle) or a terminal end of an alkyl group having 2 or more carbon atoms. The alkenyl group may be linear or branched. Although the number of carbon atoms is not specifically limited, it is 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but embodiments of the present disclosure are not limited thereto.

In the present description, the term "alkynyl group" means a hydrocarbon group including at least one carbon triple bond at a main chain (e.g., in the middle) or a terminal end of an alkyl group having 2 or more carbon atoms. The alkynyl group may be linear or branched. Although the number of carbon atoms is not specifically limited, it is 2 to 30, 2 to 20, or 2 to 10. Examples of the alkynyl group may include an ethynyl group, a propynyl group, etc., but the present disclosure is not limited thereto.

In the present description, a hydrocarbon ring group may be any suitable functional group or substituent derived from an aliphatic hydrocarbon ring, or an any suitable functional group or substituent derived from an aromatic hydrocarbon ring. The number of ring-forming carbon atoms in the hydrocarbon ring group may be 5 to 60, 5 to 30, or 5 to 20.

In the present description, the term "aryl group" means any suitable functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc., but embodiments of the present disclosure are not limited thereto.

In the present description, the fluorenyl group may be substituted, and two substituents may be combined with each other to form a spiro structure. Examples of the substituted fluorenyl group are as follows. However, embodiments of the present disclosure are not limited thereto.

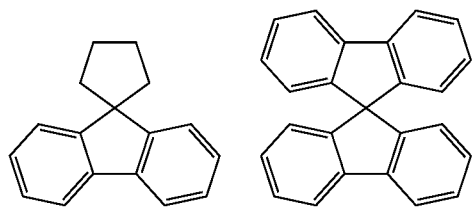

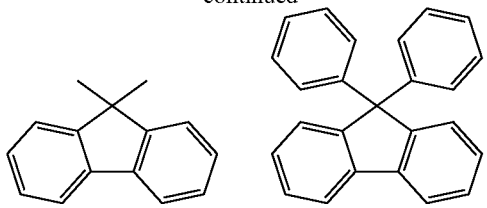

-continued

In the present description, a heterocyclic group means any suitable functional group or substituent derived from a ring containing at least one of B, O, N, P, Si, or S as a heteroatom. When the heterocyclic group contains two or more heteroatoms, the two or more heteroatoms may be the same as or different from each other. The heterocyclic group includes an aliphatic heterocyclic group and an aromatic heterocyclic group. The aromatic heterocyclic group may be a heteroaryl group. The aliphatic heterocycle and aromatic heterocycle may be monocyclic or polycyclic.

In the present description, the aliphatic heterocyclic group may include at least one of B, O, N, P, Si, or S as a heteroatom. The number of ring-forming carbon atoms in the aliphatic heterocyclic group may be 2 to 30, 2 to 20, or 2 to 10. Examples of the aliphatic heterocyclic group include an oxirane group, a thiirane group, a pyrrolidine group, a piperidine group, a tetrahydrofuran group, a tetrahydrothiophene group, a thian group, a tetrahydropyran group, a 1,4-dioxane group, etc., but embodiments of the present disclosure are not limited thereto.

In the present description, the heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazolyl group, a thiadiazole group, a phenothiazine group, a dibenzosilole group, a dibenzofuran group, etc., but embodiments of the present disclosure are not limited thereto.

In the present description, the number of carbon atoms in an amine group is not specifically limited, but may be 1 to 30. The amine group may include an alkyl amine group, an aryl amine group, or a heteroaryl amine group. Examples of the amine group include a methylamine group, a dimethylamine group, a phenylamine group, a diphenylamine group, a naphthylamine group, a 9-methyl-anthracenylamine group, a triphenylamine group, etc., but embodiments of the present disclosure are not limited thereto.

The thio group herein may include an alkylthio group and an arylthio group. The term "thiol group," as used herein, may mean that a sulfur atom is bonded to the alkyl group or the aryl group as defined above. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments of the present disclosure are not limited thereto.

The term "oxy group," as used herein, may mean that an oxygen atom is bonded to the alkyl group or the aryl group as defined above. The oxy group may include an alkoxy group and an aryl oxy group. The alkoxy group may be a linear, branched, or cyclic chain. The number of carbon atoms in the alkoxy group is not particularly limited, but for example, it may be 1 to 20 or 1 to 10. Examples of an oxy group include methoxy, ethoxy, n-propoxy, isopropoxy, butoxy, pentyloxy, hexyloxy, octyloxy, nonyloxy, decyloxy, benzyloxy, etc., but embodiments of the present disclosure are not limited thereto.

In the present description, the alkyl group among an alkylthio group, an alkylsulfoxy group, an alkylaryl group, an alkylamino group, an alkyl boron group, an alkyl silyl group, and an alkyl amine group is the same as the examples of the alkyl group described above.

In the present description, the aryl group among an aryloxy group, an arylthio group, an arylsulfoxy group, an arylamino group, an arylboron group, an arylsilyl group, an arylamine group is the same as the examples of the aryl group described above.

In the present description, the term "direct linkage" may mean a single bond.

In the present description, " ——* " refers to a position connected to an adjacent atom.

The polycyclic compound according to an embodiment of the present disclosure is represented by Formula 1 below:

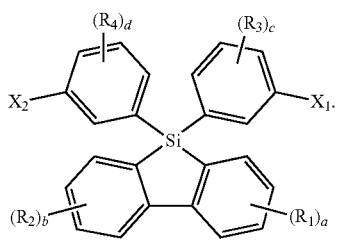

Formula 1

In Formula 1, $X_1$ and $X_2$ are each independently a substituted or unsubstituted amine group, an aryl group having 6 to 30 ring-forming carbon atoms and having at least one amine group as a substituent, or a substituted or unsubstituted heteroaryl group having 2 to 30 ring-forming carbon atoms and including at least one N.

In Formula 1, $R_1$ to $R_4$ are each independently a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 1, a is an integer of 0 to 4, while, when a is 2 or more, a plurality of $R_1$'s are the same as or different from each other.

In Formula 1, b is an integer of 0 to 4, while, when b is 2 or more, a plurality of $R_2$'s are the same as or different from each other.

In Formula 1, c is an integer of 0 to 4, while, when c is 2 or more, a plurality of $R_3$'s are the same as or different from each other.

In Formula 1, d is an integer of 0 to 4, while, when d is 2 or more, a plurality of $R_4$'s are the same as or different from each other.

In an embodiment, $X_1$ and $X_2$ in Formula 1 may be each independently represented by Formula 2 below:

Formula 2

In Formula 2, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, or are bonded to each other to form a ring.

In Formula 2, " ——* " refers to a position connected with Formula 1.

In an embodiment, Formula 2 may be represented by Formula 2-1 or Formula 2-2.

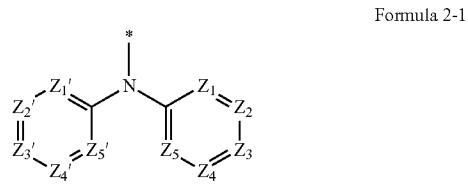

Formula 2-1

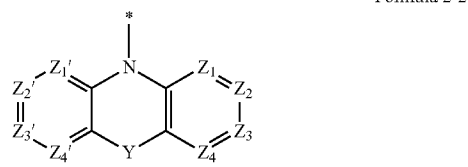

Formula 2-2

In Formula 2-1 and Formula 2-2, Y may be a direct linkage, $CR_{10}R_{11}$, O, S, $SiR_{12}R_{13}$, or $GeR_{14}R_{15}$.

In Formula 2-1 and Formula 2-2, $R_{10}$ to $R_{15}$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 2-1 and Formula 2-2, $Z_1$ to $Z_5$ and $Z_1'$ to $Z_5'$ may be each independently N or $CR_8$.

In Formula 2-1 and Formula 2-2, $R_8$ is a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 2-1 and Formula 2-2, "———•" refers to a position connected with Formula 1.

In an embodiment, $X_1$ and $X_2$ in Formula 1 may be each independently represented by Formula 3 below:

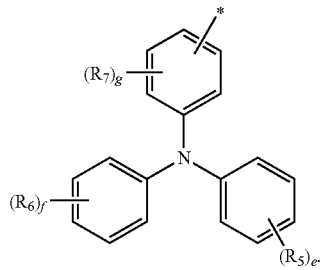

Formula 3

In Formula 3, $R_5$ to $R_7$ are each independently a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to each other to form a ring.

In Formula 3, e and f are each independently an integer of 0 to 5, while, when e is an integer of 2 or more, a plurality of $R_5$'s are the same as or different from each other, when f is an integer of 2 or more, a plurality of $R_6$'s are the same as or different from each other.

In Formula 3, g is an integer of 0 to 4, while, when g is an integer of 2 or more, a plurality of $R_7$'s are the same as or different from each other.

In Formula 3, "———•" refers to a position connected with Formula 1.

In an embodiment, Formula 3 may be represented by Formula 3-1 or Formula 3-2 below:

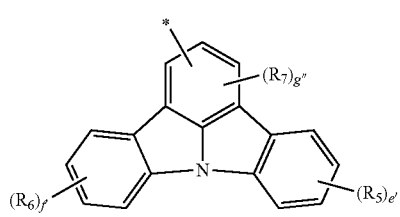

Formula 3-1

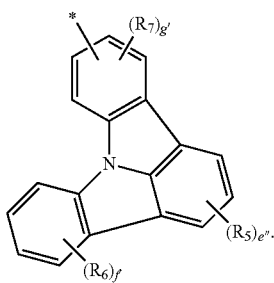

Formula 3-2

In Formula 3-1 and Formula 3-2, e' and f are each independently an integer of 0 to 5, while, when e' is an integer of 2 or more, a plurality of $R_5$'s are the same as or different from each other, when f is an integer of 2 or more, a plurality of $R_6$'s are the same as or different from each other.

In Formula 3-1 and Formula 3-2, e'' and g' are each independently an integer of 0 to 3, while, when e'' is an integer of 2 or more, a plurality of $R_5$'s are the same as or different from each other, when g' is an integer of 2 or more, a plurality of $R_7$'s are the same as or different from each other.

In Formula 3-1 and Formula 3-2, g'' is an integer of 0 to 2, while, when g'' is 2, a plurality of $R_7$'s are the same as or different from each other.

In Formula 3-1 and Formula 3-2, $R_5$ to $R_7$ are the same as those defined in Formula 3.

In Formula 3-1 and Formula 3-2, "———•" refers to a position connected with Formula 1.

In an embodiment, Formula 1 may be represented by Formula 4-1 or Formula 4-2 below:

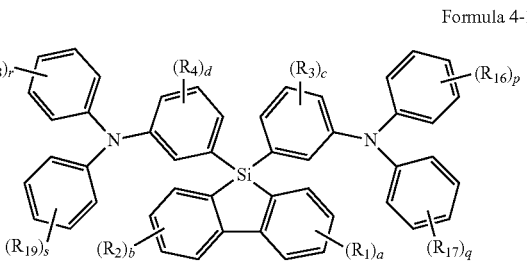

Formula 4-1

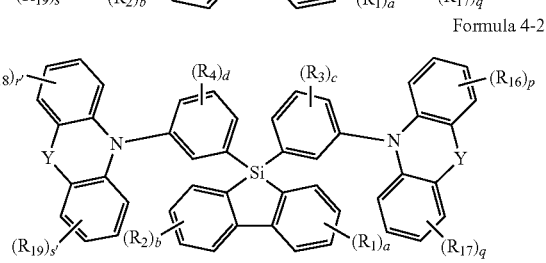

Formula 4-2

In Formula 5-1 and Formula 5-2, Y may be a direct linkage, $CR_{10}R_{11}$, O, S, $SiR_{12}R_{13}$, or $GeR_{14}R_{15}$.

In Formula 5-1 and Formula 5-2, $R_{16}$ to $R_{19}$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 5-1 and Formula 5-2, p and q are each independently an integer of 0 to 5, while, when p is an integer of 2 or more, a plurality of $R_{16}$'s are the same as or different from each other, when q is an integer of 2 or more, a plurality of $R_{17}$'s are the same as or different from each other.

In Formula 5-1 and Formula 5-2, r and s are each independently an integer of 0 to 5, while, when r is an integer of 2 or more, a plurality of $R_{18}$'s are the same as or different from each other, when s is an integer of 2 or more, a plurality of $R_{19}$'s are the same as or different from each other.

In Formula 5-1 and Formula 5-2, r' and s' are each independently an integer of 0 to 5, while, when r' is an integer of 2 or more, a plurality of $R_{18}$'s are the same as or different from each other, when s' is an integer of 2 or more, a plurality of $R_{19}$'s are the same as or different from each other.

In Formula 5-1 and Formula 5-2, $R_1$ to $R_4$, $R_5$, and a to d are the same as defined in Formula 1.

In some embodiments, the polycyclic compound represented by Formula 1 may be any one selected from among the compounds represented by Compound Group 1. However, embodiments of the present disclosure are not limited thereto.

Compound Group 1

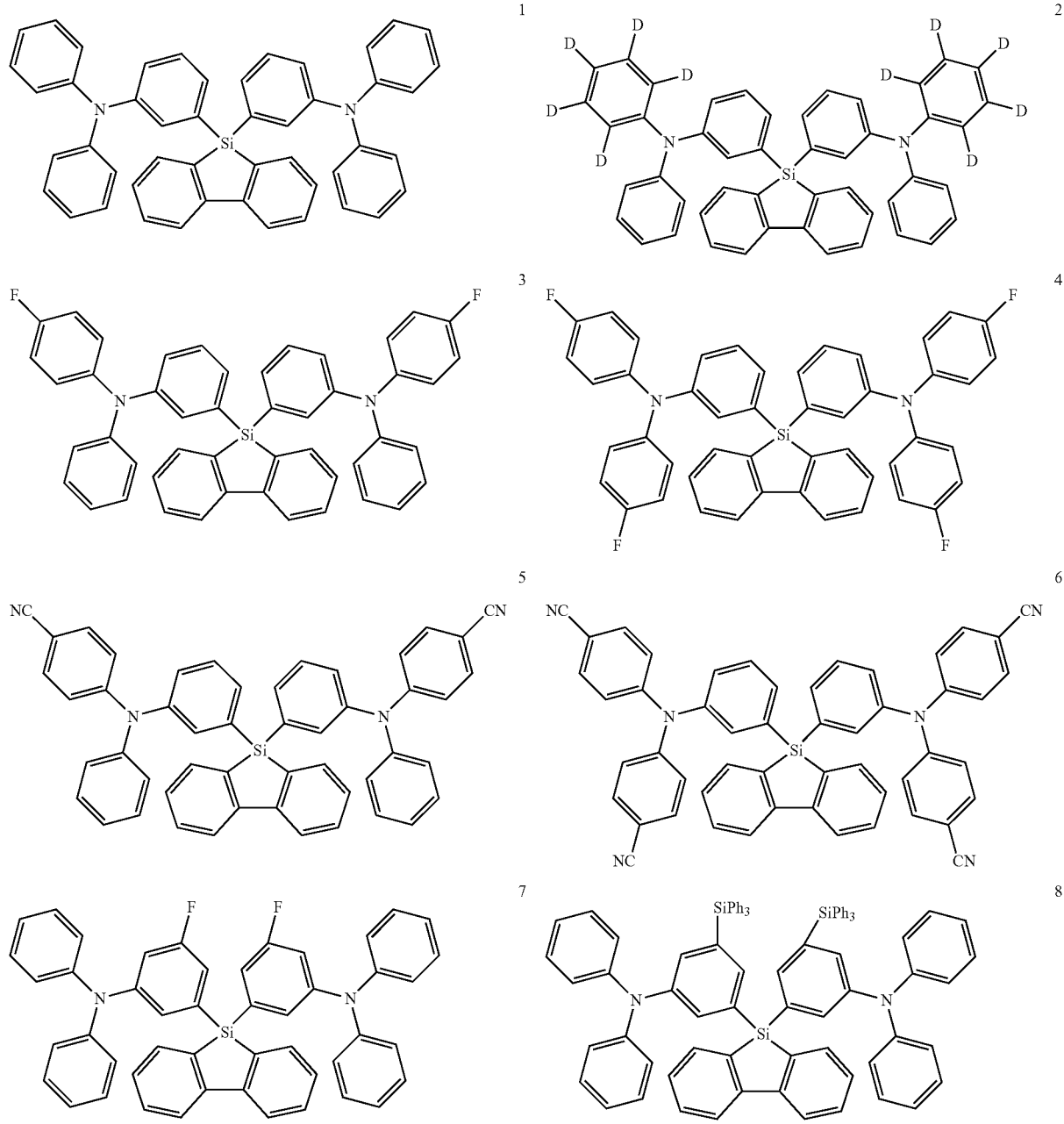

-continued
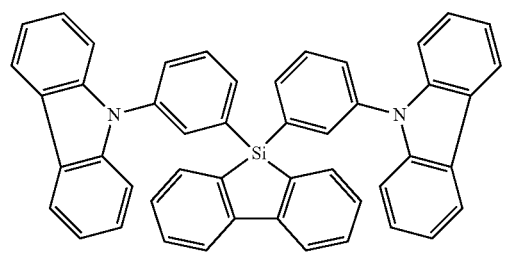
9
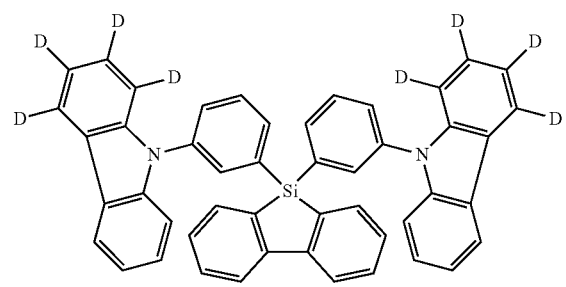
10
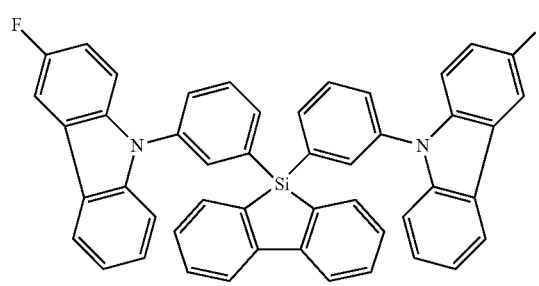
11
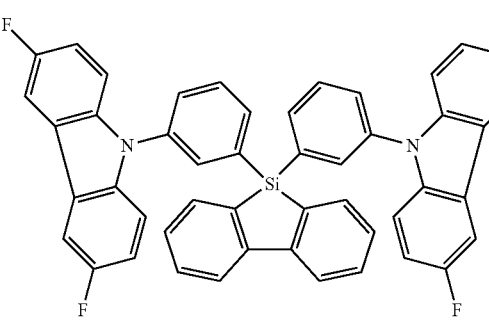
12
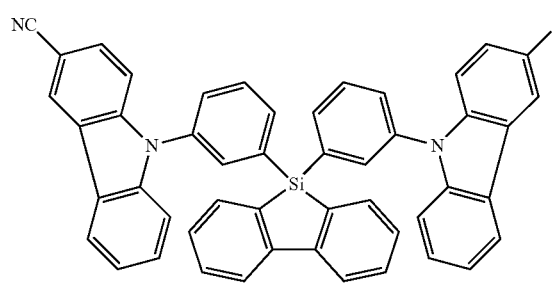
13
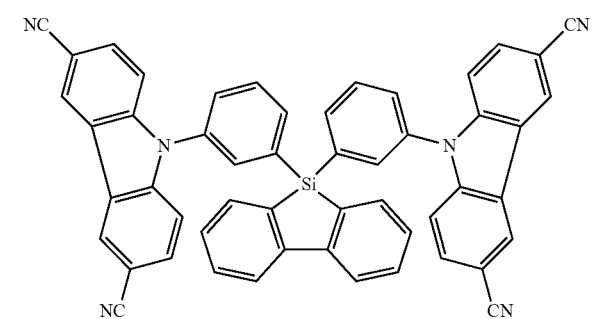
14
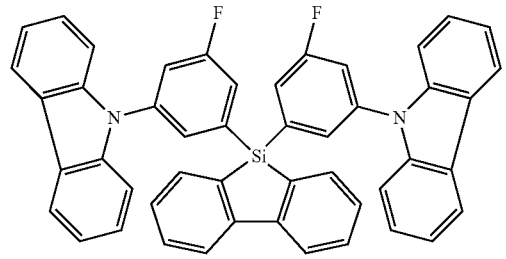
15
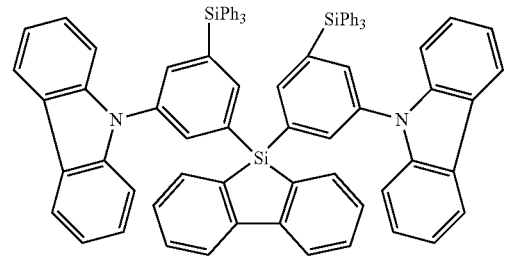
16
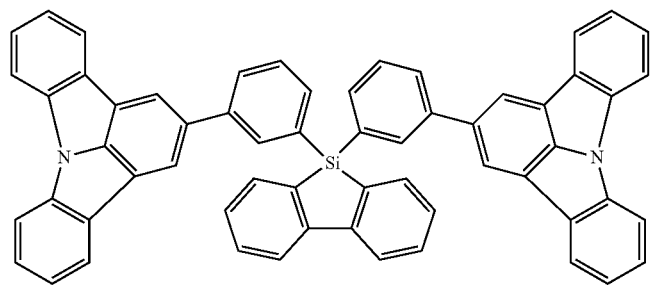
17

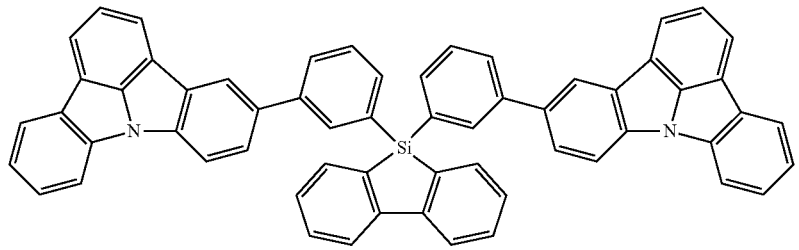

18

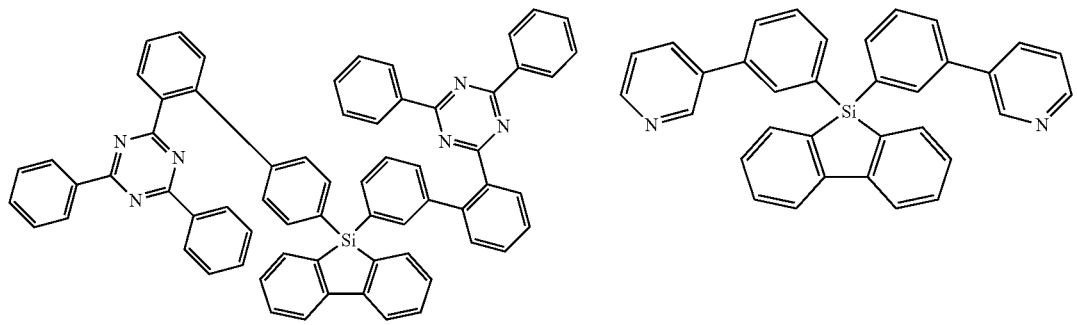

19

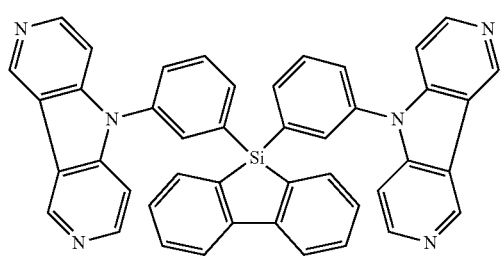

21

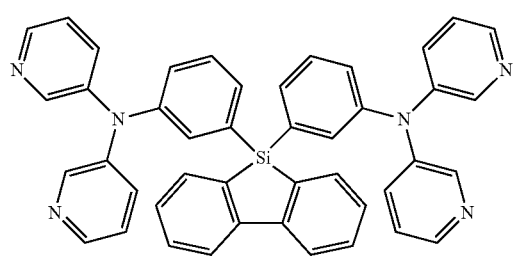

20

22

The above-described polycyclic compound may be used in the organic electroluminescence device 10 of an embodiment to improve efficiency and/or a service life of the organic electroluminescence device. For example, the above-described polycyclic compound may be used in the organic layer OL of the organic electroluminescence device 10 of an embodiment to improve luminous efficiency, electron transport properties, and/or a service life of the organic electroluminescence device.

The organic layer OL may include one or two or more of the polycyclic compounds represented by Formula 1. For example, the organic layer OL may include at least one selected from among the compounds represented by Compound Groups 1 as described above.

Referring to FIGS. 2 to 5 again, the hole transport region HTR is on the first electrode EL1. The hole transport region HTR may include at least one selected from a hole injection layer HIL, a hole transport layer HTL, a hole buffer layer, and an electron blocking layer.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, and may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments of the present disclosure are not limited thereto.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

In an embodiment, the hole injection layer HIL and/or the hole transport layer HTL may include the polycyclic compound according to an embodiment. However, embodiments of the present disclosure are not limited thereto, and the hole injection layer HIL and the hole transport layer HTL may further include any suitable material generally used in the art.

The hole injection layer HIL may further include, for example, a phthalocyanine compound such as copper phthalocyanine, N,N'-diphenyl-N,N'-bis-[4-(phenyl-m-tolylamino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPD), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4''-tris(N-carbazolyl)triphenylamine (TCTA), N,N'-di(naphthalene-I-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-Bis(N-carbazolyl)benzene (mCP), etc.

The electron blocking layer EBL may include, for example, carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4''-tris(N-carbazolyl)triphenylamine (TCTA), N,N'-di(naphthalene-I-yl)-N,N'-diplienyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mCDP), etc.

The thickness of the hole transport region HTR may be in a range from about 100 Å to about 10,000 Å, for example, from about 100 Å to about 5,000 Å. The thickness of the hole injection region HIL may be, for example, in a range from about 30 Å to about 1,000 Å, and the thickness of the hole transport layer HTL may be in a range from about 30 Å to about 1,000 Å. For example, the thickness of the electron blocking layer EBL may be in a range from about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without a substantial increase in driving voltage.

The hole transport region HTR may further include, in addition to the above-described materials, a charge generating material to increase conductivity (e.g., electrical conductivity). The charge generating material may be dispersed uniformly or non-uniformly in the hole transport region HTR. The charge generating material may be, for example, a p-dopant. The p-dopant may be at least one of quinone derivatives, metal oxides, and/or cyano group-containing compounds, but embodiments of the present disclosure are not limited thereto. For example, non-limiting examples of the p-dopant may include quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide and molybdenum oxide, etc., but embodiments of the present disclosure are not limited thereto.

As described above, the hole transport region HTR may further include at least one selected from the hole buffer layer and the electron blocking layer EBL in addition to the hole injection layer HIL and the hole transport layer HTL. The hole buffer layer, may compensate a resonance distance according to the wavelength of light emitted from an emission layer EML and may increase light emission efficiency. Materials which may be included in the hole transport region HTR may be used as materials which may be included in the hole buffer layer. The electron blocking layer EBL is a layer that serves to prevent or reduce injection of electrons from the electron transport region ETR to the hole transport region HTR.

The emission layer EML is on the hole transport region HTR. The thickness of the emission layer EML may be, for example, in a range from about 100 Å to about 1,000 Å or in a range from about 100 Å to about 300 Å. The emission layer EML may have a single layer formed of a single material, a single layer formed of a plurality of different materials, or a multilayer structure having a plurality of layers formed of a plurality of different materials.

The emission layer may emit at least one selected from red, green, blue, white, yellow, and cyan light. The emission layer EML may include a fluorescence-emitting material and/or a phosphorescence-emitting material.

In an embodiment, the emission layer EML may be a fluorescence emission layer. For example, some of the light emitted from the emission layer EML may result from thermally activated delayed fluorescence (TADF). In some embodiments, the emission layer EML may include a luminescent component that emits thermally activated delayed fluorescence, and in an embodiment, the emission layer EML may be an emission layer that emits thermally activated delayed fluorescence emitting blue light.

The emission layer EML of the organic electroluminescence device 10 of an embodiment may include the polycyclic compound according to an embodiment of the present disclosure. In some embodiments, the above-described polycyclic compound may be used in the emission layer EML of the organic electroluminescence device 10 of an embodiment to improve luminous efficiency and/or a service life of the organic electroluminescence device.

The emission layer EML may include one or two or more of the polycyclic compounds represented by Formula 1. For example, the emission layer EML may include at least one selected from among the compounds represented by Compound Groups 1 as described above.

In an embodiment, the emission layer EML may be an emission layer including a first compound and a second compound, and the polycyclic compound of an embodiment represented by Formula 1 may be included in the first compound of the emission layer EML. For example, the first compound may be a host, and the second compound may be a dopant.

In an embodiment, the host may be a host for emitting delayed fluorescence, and the dopant may be a dopant for emitting delayed fluorescence. In some embodiments, the polycyclic compound represented by Formula 1 of an embodiment may be included as a TADF host material in the emission layer EML. For example, the polycyclic compound represented by Formula 1 of an embodiment may be used as a TADF host.

In an embodiment, the host may be a host for emitting phosphorescence, and the dopant may be a dopant for emitting phosphorescence. In some embodiments, the polycyclic compound represented by Formula 1 of an embodiment may be included as a phosphorescence host material in the emission layer EML. For example, the polycyclic compound represented by Formula 1 of an embodiment may be used as a phosphorescence host.

In some embodiments, the organic electroluminescence device 10 of an embodiment may include a plurality of emission layers. The plurality of emission layers may be sequentially stacked and provided, for example, the organic electroluminescence device 10 including the plurality of emission layers may emit white light. The organic electroluminescence device including a plurality of emission layers may be an organic electroluminescence device having a tandem structure. When the organic electroluminescence device 10 includes a plurality of emission layers, at least one emission layer EML may include the polycyclic compound according to the present disclosure as described above.

The emission layer EML may further include a dopant, and any suitable material generally used in the art may be used as the dopant. For example, at least one selected from among styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenz enamine (N-BDAVBi), perylene and derivatives thereof (e.g., 2,5,8,11-tetra-t-butylperylene (TBPe)), pyrene and derivatives thereof (e.g., 1,1-dipyrene, 1,4-dipyrenylbenzene, 1,4-bis(N,N-diphenylamino)pyrene, 1,6-bis(N,N-diphenylamino)pyrene), 2,5,8,11-tetra-t-butylperylene (TBP), and 1,3,5-tris(1-phenyl-1H-benzo[d]imidazole-2-yl)benzene (TPBi) may be used as a dopant, but embodiments are not limited thereto.

The emission layer EML may further include any suitable material generally used in the art as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments of the present disclosure are not limited thereto, for example, tris(8-hydroxyquinolino)aluminum ($Alq_3$), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethylbiphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane (DPSiO3), octaphenylcyclotetra siloxane (DPSiO4), 2,8-bis(diphenylphosphoryl)dibenzofuran (PPF), etc. may be used as a host material.

In an embodiment, the emission layer EML may include any suitable material generally used in the art as a phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), and/or thulium (Tm) may be used as a phosphorescence dopant. In some embodiments, iridium(III) bis(4,6-difluorophenylpyridinato-N,C2') (Flrpic), bis(2,4-difluorophenylpyridinato)-tetrakis(1-pyrazolyl)borate iridium (III) (Fir6), and/or platinum octaethyl porphyrin (PtOEP) may be used as a phosphorescence dopant. However, embodiments of the present disclosure are not limited thereto.

In some embodiments, the emission layer EML may further include any suitable material generally used in the art as a phosphorescence host material, for example, bis(4-(9H-carbazol-9-yl)phenyl)diphenylsilane (BCPDS).

When the emission layer EML emits blue light, the emission layer EML may further include, for example, a fluorescent material including any one selected from the group consisting of spiro-DPVBi, spiro-6P, distyryl-benzene (DSB), distyryl-arylene (DSA), polyfluorene (PFO)-based polymer and poly(p-phenylene vinylene) (PPV)-based polymer. When the emission layer EML emits blue light, a dopant included in the emission layer EML may be, for example, selected from among a metal complex such as (4,6-F2ppy) 2Irpic and/or an organometallic complex, perylene and derivatives thereof.

The electron transport region ETR is on the emission layer EML. The electron transport region ETR may include at least one selected from a hole blocking layer HBL, an electron transport layer ETL, and an electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but embodiments of the present disclosure are not limited thereto. The thickness of the electron transport region ETR may be, for example, in a range from about 1,000 Å to about 1,500 Å.

The electron transport region ETR in the organic electroluminescence device 10 of an embodiment may include the polycyclic compound according to an embodiment of the present disclosure. In another embodiment, the electron injection layer EIL or the electron transport layer ETL may include the polycyclic compound according to an embodiment of the present disclosure.

When the electron transport region ETR is a multilayer structure having a plurality of layers, any one layer of the plurality of layers may include the polycyclic compound represented by Formula 1. For example, the electron transport region ETR may include the electron transport layer ETL on the emission layer EML and the electron injection layer EIL on the electron transport layer ETL, and the electron transport layer ETL or the electron injection layer EIL may include the polycyclic compound according to an embodiment of the present disclosure.

The electron transport region ETR may be formed using various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may further include any suitable material generally used in the art in addition to the polycyclic compound. When the electron transport region ETR includes the electron transport layer ETL, the electron transport region ETR may include an anthracene-based compound. However, embodiments of the present disclosure are not limited thereto, and the electron transport region may include, for example, tris(8-hydroxyquinolinato) aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-Tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), 1,3-bis[3,5-di(pyridin-3-yl)phenyl]benzene (B3PyPB), or a mixture thereof. The thickness of the electron transport layers ETL may be in a range from about 100 Å to about 1,000 Å, for example, from about 150 Å to about 500 Å. If the thickness of the electron transport layers ETL satisfies the above-described range, suitable or satisfactory electron transport characteristics may be obtained without a substantial increase in driving voltage.

If the electron transport region ETR includes the electron injection layer EIL, the electron transport region ETR may be formed using a metal halide such as LiF, NaCl, CsF, RbCl, RbI, and/or CuI, a lanthanide metal such as Yb, a metal oxide such as Li$_2$O and/or BaO, and/or 8-hydroxyl-Lithium quinolate (LiQ), etc., but embodiments of the present disclosure are not limited thereto. The electron injection layer EIL may also be formed of a mixture material of an electron transport material and an insulating organometallic salt. The organometallic salt may be a material having an energy band gap of about 4 eV or more. For example, the organometallic salt may include metal acetates, metal benzoates, metal acetoacetates, metal acetylacetonates and/or metal stearates. The thickness of the electron injection layers EIL may be in a range from about 1 Å to about 100 Å, and from about 3 Å to about 90 Å. If the thickness of the electron injection layer EIL satisfies the above-described range, suitable or satisfactory electron injection properties may be obtained without a substantial increase in driving voltage.

The electron transport region ETR may include a hole blocking layer HBL as described above. The hole blocking layer HBL may include, for example, at least one selected from diphenyl(4-(triphenylsilyl)phenyl)-phosphine oxide (TSPO1), 2,9-dimethyl-4,7-diphenyl-1,10-phenanthroline (BCP), bis[2-(diphenylphosphino)phenyl]ether oxide (DPEPO), and 4,7-diphenyl-1,10-phenanthroline (Bphen), but embodiments of the present disclosure are not limited thereto.

The second electrode EL2 is on the electron transport region ETR. The second electrode EL2 may be a common electrode or a negative electrode. The second electrode EL2 may be a transmissive electrode, a transflective electrode, or a reflective electrode. When the second electrode EL2 is the transmissive electrode, the second electrode EL2 may be formed of transparent metal oxides, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a multilayer structure including a reflective layer or a transflective layer formed of the above-described materials, and a transparent conductive layer formed of ITO, IZO, ZnO, ITZO, etc.

In some embodiments, the second electrode EL2 may be coupled with an auxiliary electrode. When the second electrode EL2 is coupled with the auxiliary electrode, the resistance of the second electrode EL2 may decrease.

Referring to FIG. 4, the organic electroluminescence device 10 according to an embodiment may further include a capping layer CPL on the second electrode EL2. The capping layer CPL may include a multilayer or a single layer. In an embodiment, the capping layer CPL may be an organic layer or an inorganic layer. For example, when the capping layer CPL includes an inorganic material, the inorganic material may include an alkaline metal compound such as LiF, an alkaline earth metal compound such as MgF$_2$, SiON, SiN$_x$, SiOy, etc.

For example, when the capping layer CPL includes an organic material, the organic material may include α-NPD, NPB, TPD, m-MTDATA, Alq$_3$, CuPc, N4,N4,N4',N4'-tetra(biphenyl-4-yl)biphenyl-4,4'-diamine (TPD15), 4,4',4"-tris(carbazol sol-9-yl)triphenylamine (TCTA), etc., and/or an epoxy resin, and/or acrylate such as methacrylate. However, embodiments of the present disclosure are not limited thereto, and the organic material may also include Compounds P1 to P5 below.

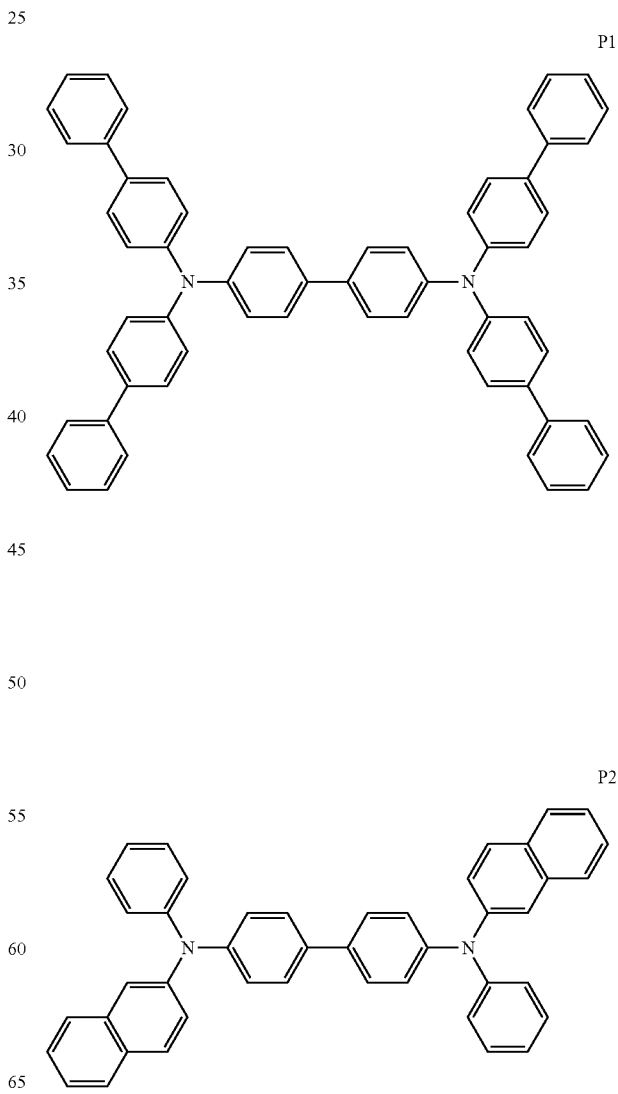

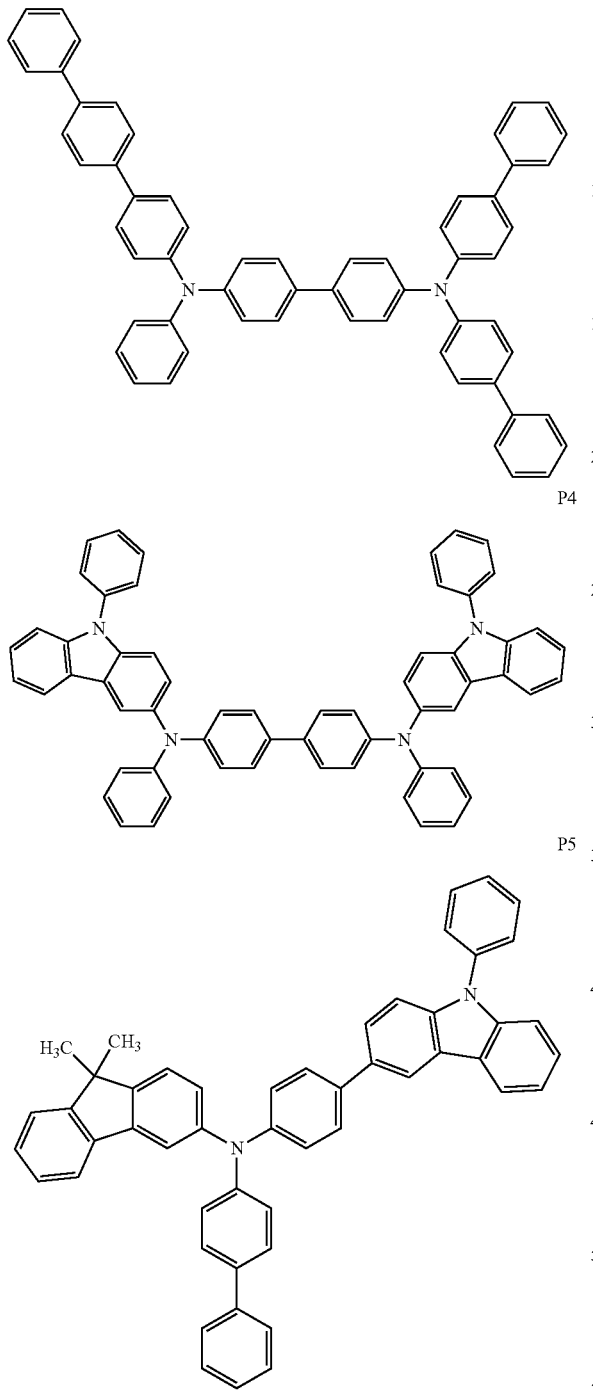

The organic electroluminescence device 10 according to an embodiment of the present disclosure may include the polycyclic compound represented by Formula 1 as described above to thereby obtain superior luminous efficiency and/or long service life characteristics. In addition, the organic electroluminescence device 10 of an embodiment may achieve high efficiency and/or long service life characteristics in a blue wavelength region.

Hereinafter, with reference to Examples and Comparative Examples, a compound according to embodiments of the present disclosure and an organic electroluminescence device of an embodiment will be described in more detail. In addition, the Examples shown below are illustrated only for the understanding of the subject matter of this disclosure, and the scope of the present disclosure is not limited thereto.

EXAMPLES

Synthesis of Polycyclic Compound

In the following descriptions, a synthetic method of a polycyclic compound is provided as an example, but the synthetic method according to an embodiment of the present disclosure is not limited to the following examples.

1. Synthesis of Compound 9

Synthesis of 2,2'-dibromo-1,1'-biphenyl

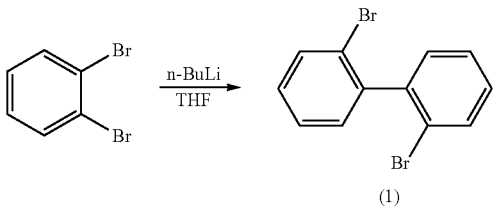

1,2-dibromobenzene (40.00 g, 169.556 mmol) were added in a well-dried 1 L three-necked round bottom flask and dissolved in dry tetrahydrofuran (500 mL), and then the resultant mixture was stirred. While maintaining the temperature at about −78° C., 2.5 M n-BuLi (33.9 mL, 84.778 mmol) was slowly added dropwise thereto. After adding dropwise, the resultant mixture was stirred for about one hour while maintaining the temperature at about −78° C., and then stirred while slowly elevating the temperature to room temperature. 2N HCl (50 mL) was added thereto and the mixture was stirred for about 30 minutes, extracted with water and dichloromethane, dried over $MgSO_4$, and then applied with silica. The resultant product was purified by column chromatography using an n-hexane solvent to obtain a solid compound (1) (18.83 g, yield: 71.2%) (1H-NMR (300 MHz, CD2Cl2) δ=7.73-7.70 (m, 2H), 7.47-7.41 (m, 2H), 7.35-7.28 (m, 4H)).

Synthesis of 5,5-bis(3-bromophenyl)-5H-dibenzo[b,d]silole

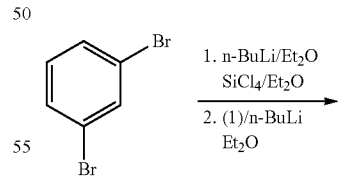

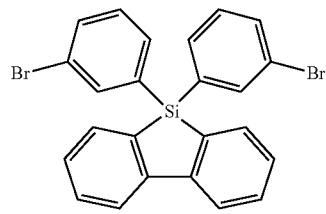

1,3-dibromobenzene (14.58 g, 61.805 mmol) was added in a well-dried 500 mL three-necked round bottom flask (1) and dissolved in dry ethyl ether (170 mL), and then 2.5 M n-BuLi (24.72 mL, 61.805 mmol) was added dropwise thereto at about −78° C. The resultant mixture was stirred at about −78° C. for about one hour. SiCl₄ (5 g, 29.431 mmol) was added in a well-dried 500 mL three-necked round bottom flask (2) and dissolved in dry ethyl ether (20 mL), and then the resultant mixture was stirred while maintaining the temperature at about −78° C. The first reactant was added dropwise to a prepared glass (2). The first reactant was stirred while slowly elevating the temperature to room temperature. After the reaction was completed, the produced solid was settled down, and only the filtrate was moved to a nitrogen-purged glass (3) and then stirred. 2,2'-dibromo-1,1'-biphenyl (9.19 g, 29.441 mmol) was added in a well-dried 250 mL three-necked round bottom flask and dissolved in dry ethyl ether (80 mL), and then 2.5 M n-BuLi (27 mL, 67.715 mmol) was added dropwise thereto at −78° C. The resultant mixture was stirred for 1 hour at about −78° C., the ice bath was removed, the temperature was elevated to room temperature for about one hour, and the mixture was then added dropwise to the glass (3) and stirred. After the reaction was completed, the mixture was extracted with ethyl ether and water, dried over MgSO₄, and then applied with silica. The resultant product was purified by column chromatography using an n-hexane/dichloromethane (5/1) solvent to obtain a solid compound (2) (4.93 g, yield: 34%). (1H-NMR (300 MHz, CD2Cl2) δ=7.92 (d, J=7.8 Hz, 2H), 7.79-7.76 (m, 2H), 7.72-7.71 (m, 2H), 7.59-7.51 (m, 6H), 7.39-7.34 (m, 2H) 7.28-7.23 (m, 2H)).

Synthesis of Compound 9

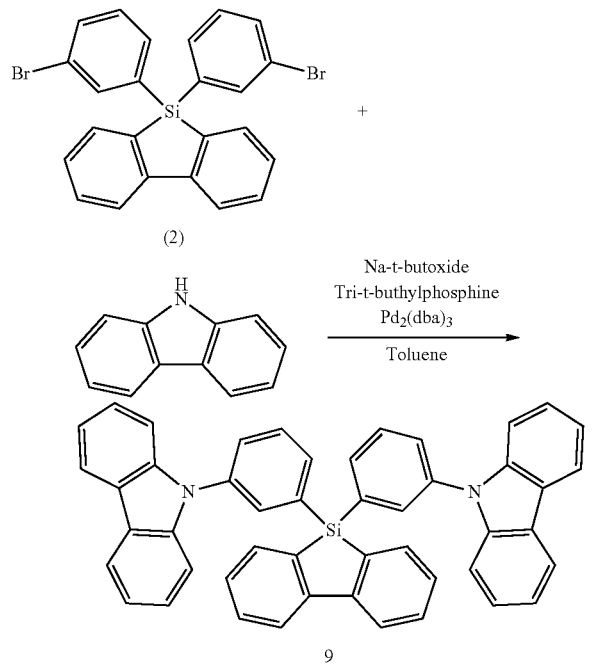

5,5-bis(3-bromophenyl)-5H-dibenzo[b,d]silole (4 g, 8.125 mmol), carbazole (2.99 g, 17.876 mmol), sodium tert-butoxide (2.343 g, 24.376 mmol), tri-tert-butylphosphine (0.16 g, 0.813 mmol), and tris(dibenzylideneacetone)dipalladium(0) (0.37 g, 0.406 mmol) were added in a well-dried 500 mL three-necked round bottom flask and dissolved in toluene (30 mL), and then the resultant mixture was stirred at about 90° C. After the reaction was completed, the mixture was extracted with ethyl acetate and water, dried over MgSO₄, and then applied with silica. The resultant product was purified by column chromatography using an n-hexane/ethyl acetate (5/1) solvent to obtain a solid compound 9 (3.5 g, yield: 64.8%). (1H-NMR (300 MHz, CD2Cl2) δ=8.03-8.00 (m, 4H), 7.84-7.77 (m, 6H), 7.71-7.68 (m, 2H), 7.55-7.53 (m, 4H), 7.45-7.40 (m, 2H) 7.29-7.12 (m, 14H)).

2. Synthesis of Compound 1

The synthesis of Compound 1 was performed by substantially the same method as the synthesis of Compound 9 except that diphenylamine was used instead of carbazole.

3. Synthesis of Compound 5

The synthesis of Compound 5 was performed by substantially the same method as the synthesis of Compound 9 except that 4',4'''-azanediylbis(([1,1'-biphenyl]-4-carbonitrile)) was used instead of carbazole.

4. Synthesis of Compound 20

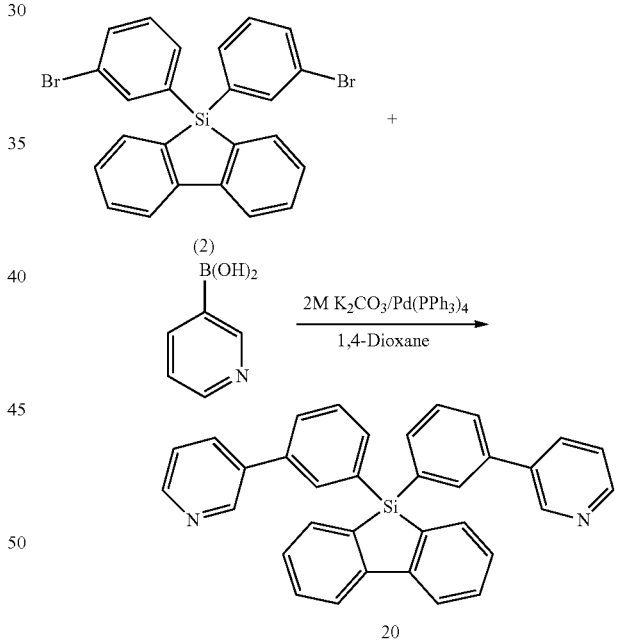

5,5-bis(3-bromophenyl)-5H-dibenzo[b,d]silole (4.00 g, 8.125 mmol), pyridin-3-ylboronic acid (3 g, 24.376 mmol), 2 M potassium carbonate (30 mL), and tetrakis(triphenylphosphine)palladium(0) (0.47 g, 0.406 mmol) were added in a well-dried 250 mL three-necked round bottom flask and dissolved in 1,4-dioxane (100 mL), and then the resultant mixture was refluxed for about 10 hours at about 90° C. After being cooled to room temperature, the resultant reaction solution was poured into water (600 mL). Then, the produced solid was filtered, extracted with chloroform and water, dried over MgSO₄, and then applied with silica. The resultant product was purified by column chromatography using an n-hexane/THF (2/1) solvent to obtain a solid compound (3.76 g, yield: 72%). (1H-NMR (300 MHz, CD2Cl2) δ=8.83 (dd, J=0.7 Hz, J=2.4 Hz, 2H), 8.57 (dd, J=1.6 Hz, J=4.8 Hz, 2H), 8.15 (dd, J=0.6 Hz, J=7.1 Hz, 2H), 8.07 (d, J=7.8 Hz, 2H), 8.02-7.98 (m, 4H), 7.83-7.76 (m, 4H), 7.59-7.54 (m, 4H), 7.50-7.39 (m, 4H)).

5. Synthesis of Compound 2

The synthesis of Compound 2 was performed by substantially the same method as the synthesis of Compound 9 except that N-phenylbenzen-d5-amine was used instead of carbazole.

6. Synthesis of Compound 17

The synthesis of Compound 17 was performed by substantially the same method as the synthesis of Compound 20 except that indolo[3,2,1-jk]carbazol-2-ylboronic acid was used instead of pyridin-3-ylboronic acid.

7. Synthesis of Compound 19

The synthesis of Compound 19 was performed by substantially the same method as the synthesis of Compound 20 except that (2-(4,6-diphenyl-1,3,5-triazin-2-yl)phenyl)boronic acid was used instead of pyridin-3-ylboronic acid.

8. Synthesis of Compound 22

The synthesis of Compound 22 was performed by substantially the same method as the synthesis of Compound 9 except that di(pyridin-3-yl)amine was used instead of carbazole.

9. Synthesis of Compound 12

The synthesis of Compound 12 was performed by substantially the same method as the synthesis of Compound 9 except that 3,6-difluoro-9H-carbazole was used instead of carbazole.

Organic electroluminescence devices were manufactured using the Example Compounds and the Comparative Example Compounds below as an emission layer material:

Example Compounds

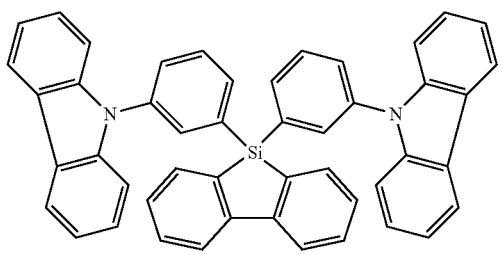
1

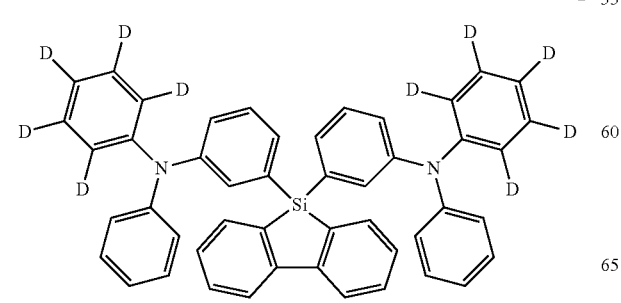
2

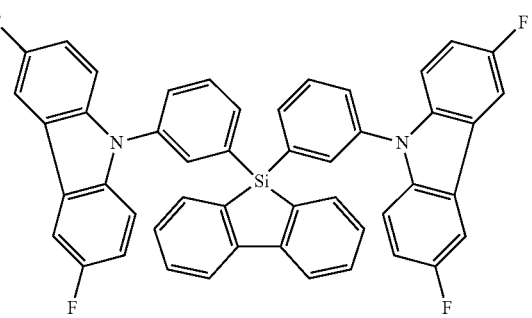
9

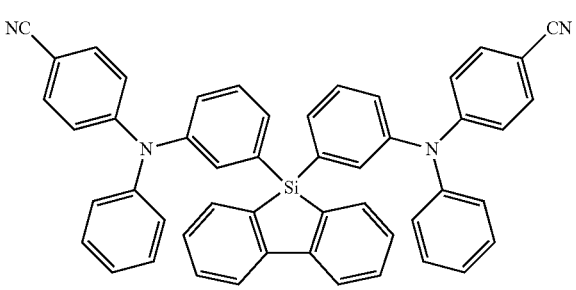
12

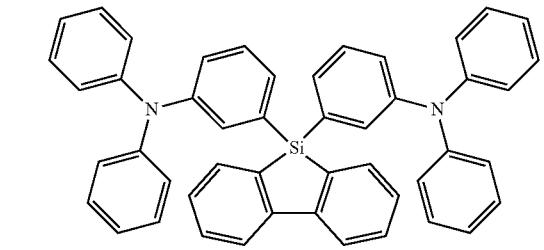
5

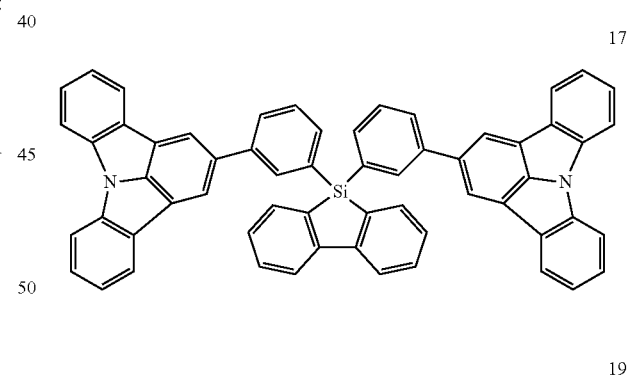
17

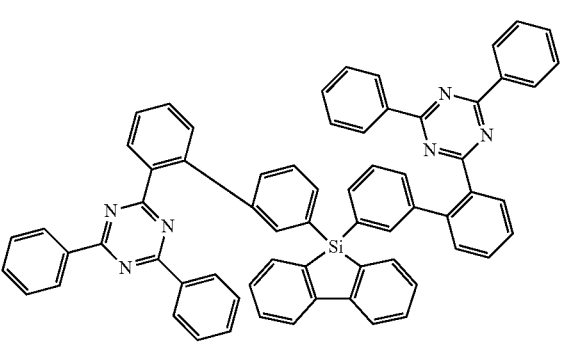
19

-continued

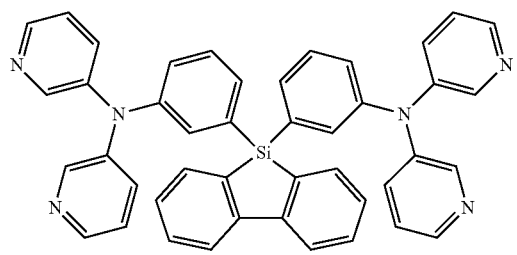

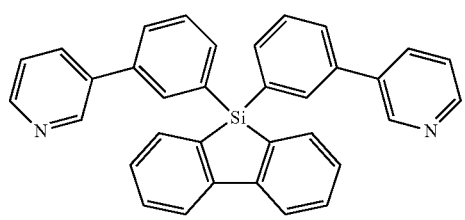

Comparative Example Compounds

R1
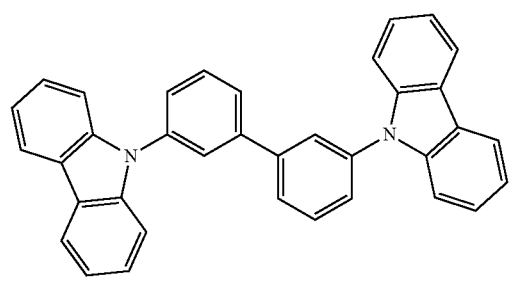

R2
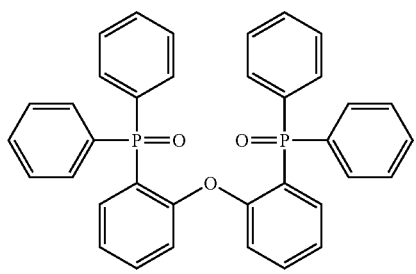

R3
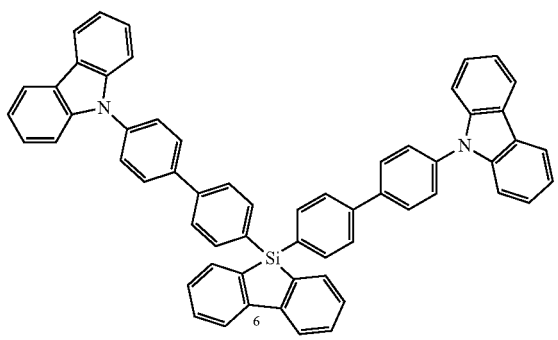

-continued

R4
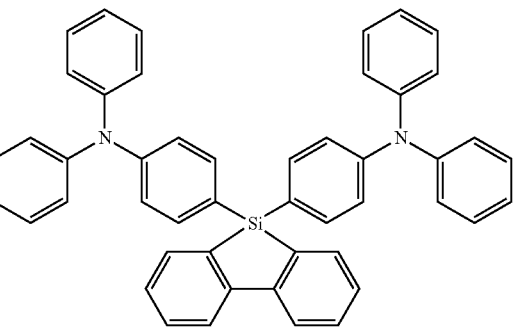

R5
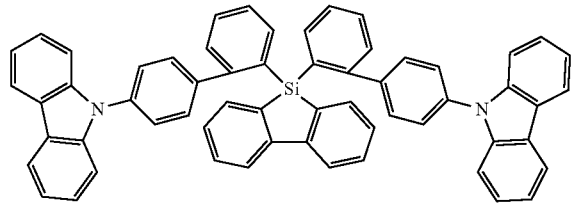

1. Organic Electroluminescence Devices of Examples 1 to 3 and Comparative Example 1

For a positive electrode, an ITO glass substrate of about 15 Ω/cm² (about 1,200 Å) made by Corning Co. was cut to a size of 50 mm×50 mm×0.7 mm, cleansed by ultrasonic waves using isopropyl alcohol and pure water for about five minutes, and then irradiated with ultraviolet rays for about 30 minutes and exposed to ozone and cleansed. The glass substrate was installed on a vacuum deposition apparatus. On the upper portion of the substrate, 2-TNATA, an existing compound, was first deposited under vacuum to form a 600 Å-thick hole injection layer, and then NPB as a hole transporting compound was deposited under vacuum to form a 300 Å-thick hole transport layer. On the upper portion of the hole transport layer, in a blue phosphorescence emission layer, Firpic as a dopant with a ratio of about 10% and BCPDS and Example Compound 1, 2, 9 or Comparative Example Compound R1 as a mixed host with a weight ratio of about 1:1 were co-deposited to form a 300 Å-thick emission layer. Then, TSP01 was deposited in vacuum to form a 50 Å-thick hole blocking layer. Then, Alq₃ was deposited to form a 300 Å-thick electron transport layer, LiF that is an alkaline metal halide was deposited on the upper portion of the electron transport layer to form a 10 Å-thick electron injection layer, and Al was deposited under vacuum to form a 3,000 Å-thick LiF/Al electrode (negative electrode), thereby manufacturing an organic electroluminescence device.

2. Organic Electroluminescence Devices of Examples 4 to 5 and Comparative Example 2

For a positive electrode, an ITO glass substrate of about 15 Ω/cm² (about 1,200 Å) made by Corning Co. was cut to a size of 50 mm×50 mm×0.7 mm, cleansed by ultrasonic waves using isopropyl alcohol and pure water for about five minutes, and then irradiated with ultraviolet rays for about 30 minutes and exposed to ozone and cleansed. The glass substrate was installed on a vacuum deposition apparatus. On the upper portion of the substrate, NPD, an existing compound, was deposited in vacuum to form a 600 Å-thick hole injection layer, and then mCP as a hole transporting compound was deposited under vacuum to form a 300

Å-thick hole transport layer. On the upper portion of the hole transport layer, Compound 2 or 5 of the present disclosure or Comparative Example Compound R2 and ACRSA, an existing compound, were co-deposited to a weight ratio of about 98:2 to form a 300 Å-thick emission layer. Then, on the upper portion of the emission layer, TSP01 was deposited in vacuum to form a 50 Å-thick hole blocking layer. Then, Alq$_3$ was deposited to form a 300 Å-thick electron transport layer, LiF that is an alkaline metal halide was deposited on the upper portion of the electron transport layer to form a 10 Å-thick electron injection layer, and Al was deposited under vacuum to form a 3,000 Å-thick LiF/Al electrode (negative electrode), thereby manufacturing an organic electroluminescence device.

3. Organic Electroluminescence Devices of Examples 6, 9 and Comparative Examples 3 to 5

For a positive electrode, an ITO glass substrate of about 15 Ω/cm$^2$ (about 1,200 Å) made by Corning Co. was cut to a size of 50 mm×50 mm×0.7 mm, cleansed by ultrasonic waves using isopropyl alcohol and pure water for about five minutes, and then irradiated with ultraviolet rays for about 30 minutes and exposed to ozone and cleansed. The glass substrate was installed on a vacuum deposition apparatus. On the upper portion of the substrate, 2-TNATA, an existing compound, was deposited in vacuum to form a 600 Å-thick hole injection layer, and then NPB as a hole transporting compound was deposited under vacuum to form a 300 Å-thick hole transport layer. On the upper portion of the hole transport layer, in a blue phosphorescence emission layer, Firpic as a dopant with a ratio of about 10% and BCPDS and Example Compound 17, 20 or Comparative Example Compound R3, R4, or R5 as a mixed host with a weight ratio of about 1:1 were co-deposited to form a 300 Å-thick emission layer. Then, TSPO1 was deposited under vacuum to form a 50 Å-thick hole blocking layer. Then, Alq$_3$ was deposited to form a 300 Å-thick electron transport layer, LiF that is an alkaline metal halide was deposited on the upper portion of the electron transport layer to form a 10 Å-thick electron injection layer, and Al was deposited under vacuum to form a 3,000 Å-thick LiF/Al electrode (negative electrode), thereby manufacturing an organic electroluminescence device.

4. Organic Electroluminescence Devices of Examples 7 and 8

For an anode, an ITO glass substrate of about 15 Ω/cm$^2$ (about 1,200 Å) made by Corning Co. was cut to a size of 50 mm×50 mm×0.7 mm, cleansed by ultrasonic waves using isopropyl alcohol and pure water for about five minutes, and then irradiated with ultraviolet rays for about 30 minutes and exposed to ozone and cleansed. The glass substrate was installed on a vacuum deposition apparatus. On the upper portion of the substrate, NPD, an existing compound, was deposited in vacuum to form a 600 Å-thick hole injection layer, and then mCP as a hole transporting compound was deposited under vacuum to form a 300 Å-thick hole transport layer. On the upper portion of the hole transport layer, Compound 19 or 22 of the present disclosure and ACRSA were co-deposited to a weight ratio of about 982 to form a 300 Å-thick emission layer. Then, TSP01 was deposited in vacuum to form a 50 Å-thick hole blocking layer. Then, Alq$_3$ was deposited to form a 300 Å-thick electron transport layer, LiF that is an alkaline metal halide was deposited on the upper portion of the electron transport layerto form a 10 Å-thick electron injection layer, and Al was deposited under vacuum to form a 3,000 Å-thick LiF/Al electrode (negative electrode), thereby manufacturing an organic electroluminescence device.

Evaluation of Organic Electroluminescence Device Characteristics

TABLE 1

|  | Emission layer Host | Driving voltage (V) | Current density (mA/cm$^2$) | Brightness (cd/m$^2$) | Efficiency (cd/A) | Luminous color | Half service life (hr @100 mA/cm$^2$) |
|---|---|---|---|---|---|---|---|
| Example 1 | Example Compound 1 | 5.66 | 50 | 3356 | 6.712 | Blue | 320 |
| Example 2 | Example Compound 2 | 5.49 | 50 | 3591 | 7.182 | Blue | 340 |
| Example 3 | Example Compound 9 | 5.9 | 50 | 3493 | 6.986 | Blue | 317 |
| Example 4 | Example Compound 2 | 6.01 | 50 | 2975 | 5.95 | Blue | 301 |
| Example 5 | Example Compound 5 | 5.74 | 50 | 3870 | 7.74 | Blue | 334 |
| Example 6 | Example Compound 17 | 4.03 | 5.17 | 1000 | 19.4 | Blue | 360 |
| Example 7 | Example Compound 19 | 4.02 | 5.14 | 1000 | 19.5 | Blue | 327 |
| Example 8 | Example Compound 22 | 4.20 | 5.13 | 1000 | 19.5 | Blue | 311 |
| Example 9 | Example Compound 20 | 4.11 | 5.28 | 1000 | 19.6 | Blue | 356 |
| Comparative Example 1 | Compound R1 | 6.99 | 50 | 2745 | 5.27 | Blue | 266 |
| Comparative Example 2 | Compound R2 | 6.71 | 50 | 2499 | 5.17 | Blue | 290 |
| Comparative Example 3 | Compound R3 | 5.67 | 10.6 | 1000 | 9.51 | Blue | 210 |
| Comparative Example 4 | Compound R4 | 5.11 | 9.7 | 1000 | 10.5 | Blue | 230 |
| Comparative Example 5 | Compound R5 | 5.49 | 10.1 | 1000 | 10.1 | Blue | 90 |

Referring to the results of Table 1, it can be seen that when the polycyclic compound according to an example is included in the emission layer, the organic electroluminescence device has low driving voltage, and improved brightness, efficiency, and service life compared to Comparative Examples.

Comparative Examples 1 and 2 are devices using Compounds R1 and R2 respectively, which are existing host materials, and the driving voltage was higher and both efficiency and a service life decreased compared to the Examples.

Compounds R3 and R4 of Comparative Examples 3 and 4, respectively, have a lower T1 energy level by about 12-17% compared to the compounds according to embodiments of the present disclosure. Therefore, Comparative Examples 3 and 4 had a large decrease in efficiency of the device, and thus the driving voltage and service life characteristics were inferior.

For Comparative Example 5, Compound R5 used as a host had a high T1 energy level of about 3.15 eV, thereby exhibiting high efficiency characteristics, but a service life was inferior due to a decrease in structural stability.

The organic electroluminescence device of an example may achieve high luminous efficiency and/or a long service life in a blue light wavelength region by using the polycyclic compound represented by Formula 1 as an emission layer material.

The polycyclic compound of an example may be used as the emission layer material, thereby achieving high luminous efficiency and/or a long service life of the organic electroluminescence device in the blue light wavelength region.

The organic electroluminescence device according to an embodiment of the present disclosure may achieve high efficiency and/or a long service life.

The polycyclic compound according to an embodiment of the present disclosure may improve efficiency and/or service life of the organic electroluminescence device.

Although the subject matter of the present disclosure has been described with reference to embodiments of the present disclosure, it will be understood that the present disclosure should not be limited to these embodiments but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

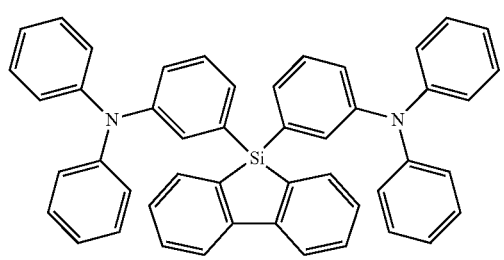

2
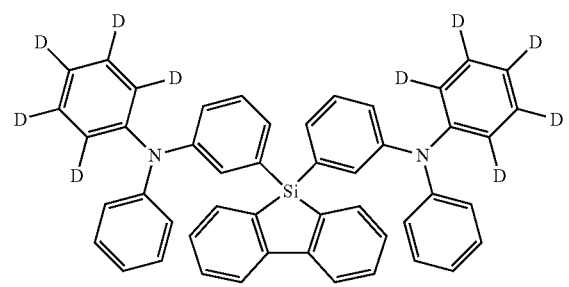
3
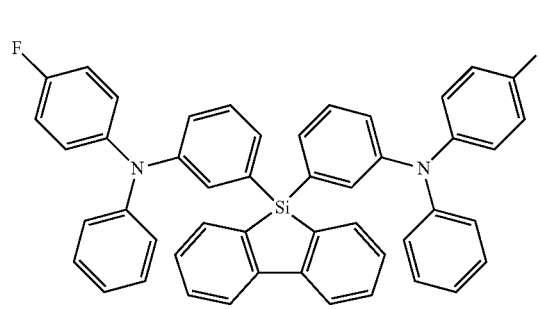
4
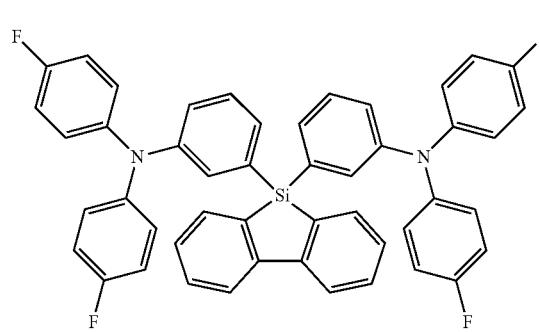
5
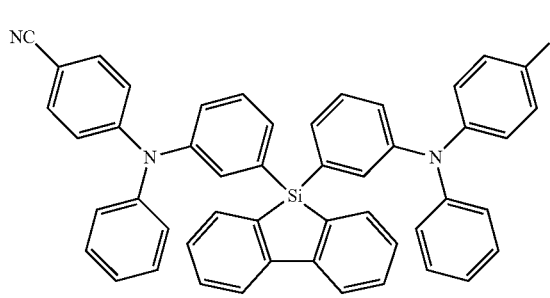
6
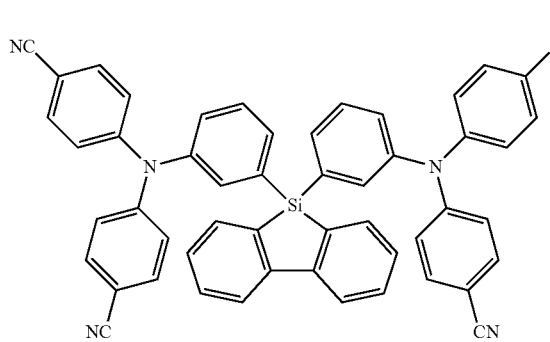
7
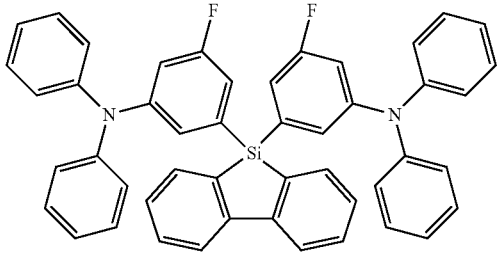
8
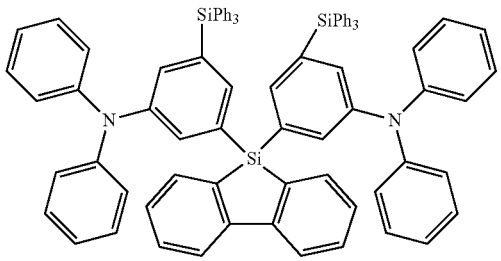
9
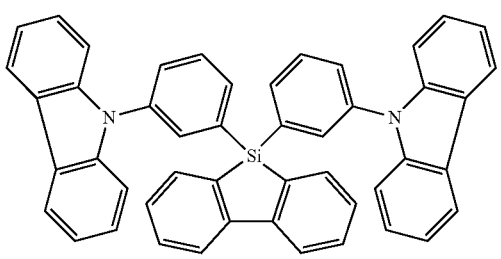
10
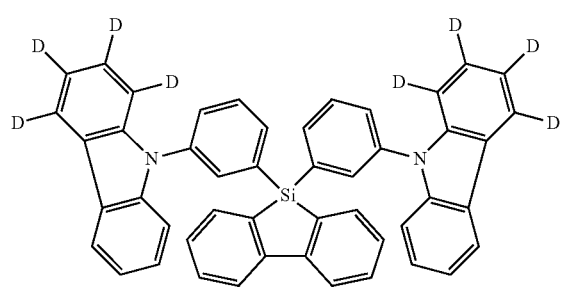
11
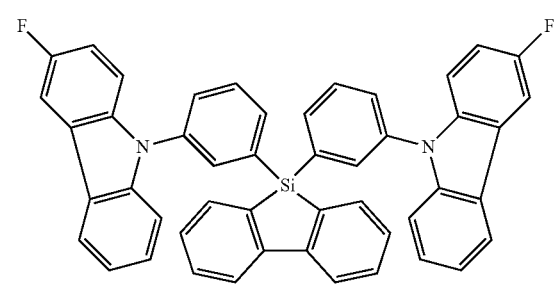

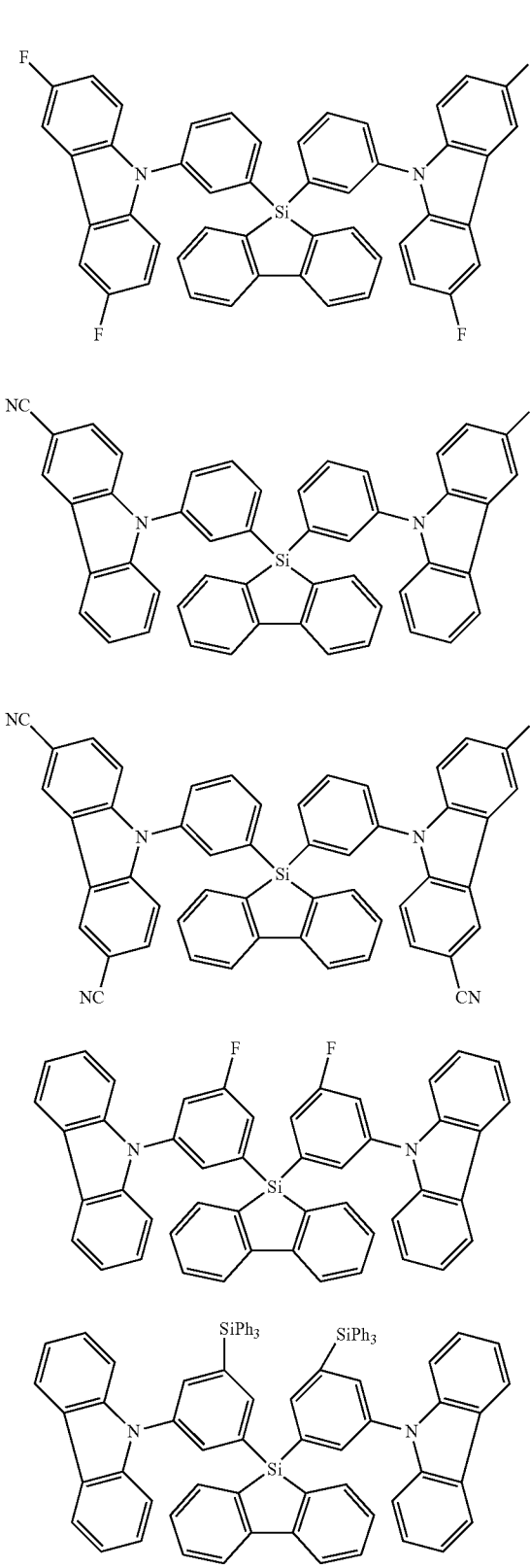

What is claimed is:

1. An organic electroluminescence device comprising:
a first electrode;
an organic layer on the first electrode; and
a second electrode on the organic layer,
wherein the organic layer comprises a polycyclic compound represented by Formula 1 below:

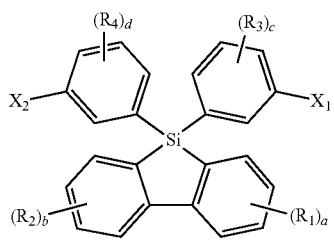

Formula 1 wherein, in Formula 1,
$R_1$ to $R_4$ are each independently a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
a to d are each independently an integer of 0 to 4,
$X_1$ and $X_2$ are both 2,4,6-triphenyl-1,3,5-triazine or pyridine group, or
$X_1$ and $X_2$ are each independently represented by Formula 2 or Formula 3:

Formula 2 wherein, in Formula 2,
$Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, or are bonded to each other to form a ring,

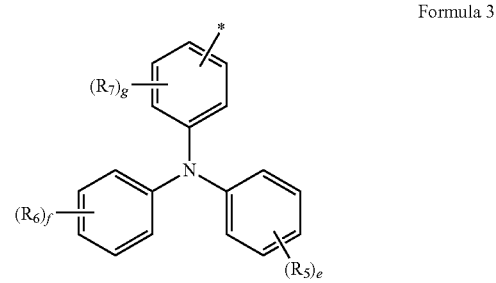

Formula 3 wherein, in Formula 3,
$R_5$ to $R_7$ are each independently a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to each other to form a ring,
e and f are each independently an integer of 0 to 5, and
g is an integer of 0 to 4.

2. The organic electroluminescence device of claim 1, wherein the organic layer comprises:
a hole transport region on the first electrode;
an emission layer on the hole transport region; and
an electron transport region on the emission layer, and at least one layer selected from the hole transport region, the emission layer, and the electron transport region comprises the polycyclic compound.

3. The organic electroluminescence device of claim 2, wherein the emission layer comprises a first compound and a second compound, and the first compound is the polycyclic compound.

4. The organic electroluminescence device of claim 3, wherein the emission layer is a thermally activated delayed fluorescence emission layer that emits blue light.

5. The organic electroluminescence device of claim 3, wherein the emission layer is a phosphorescence emission layer that emits blue light.

6. The organic electroluminescence device of claim 2, wherein the electron transport region comprises:

an electron transport layer on the emission layer; and an electron injection layer on the electron transport layer, wherein at least one selected from the electron transport layer and the electron injection layer comprises the polycyclic compound.

7. The organic electroluminescence device of claim 2, wherein the hole transport region comprises:

a hole injection layer on the first electrode; and a hole transport layer on the hole injection layer, wherein at least one selected from the hole injection layer and the hole transport layer comprises the polycyclic compound.

8. The organic electroluminescence device of claim 1, wherein Formula 2 is represented by Formula 2-1 or Formula 2-2:

Formula 2-1

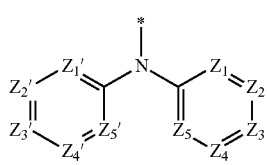

Formula 2-2

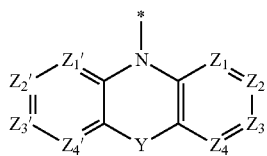

wherein, in Formula 2-1 and Formula 2-2,

Y is a direct linkage, $CR_{10}R_{11}$, O, S, $SiR_{12}R_{13}$, or $GeR_{14}R_{15}$, $R_{10}$ to $R_{15}$ are each independently a hydrogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $Z_1$ to $Z_5$ and $Z_1'$ to $Z_5'$ are each independently N or $CR_8$, $R_8$ is a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

9. The organic electroluminescence device of claim 1, wherein Formula 3 is represented by Formula 3-1 or Formula 3-2:

Formula 3-1

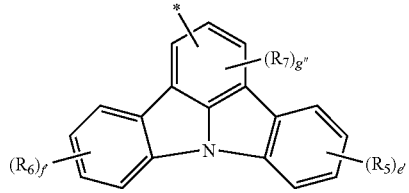

Formula 3-2

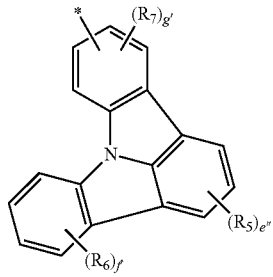

wherein, in Formula 3-1 and Formula 3-2, e' and f are each independently an integer of 0 to 4, e" and g' are each independently an integer of 0 to 3, g" is an integer of 0 to 2, and $R_5$ to $R_7$ are the same as defined in Formula 3.

10. The organic electroluminescence device of claim 1, wherein Formula 1 is represented by Formula 4-1 or Formula 4-2:

Formula 4-1

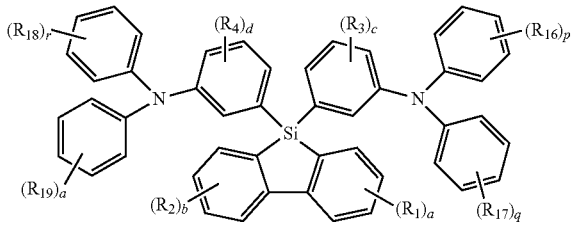

Formula 4-2

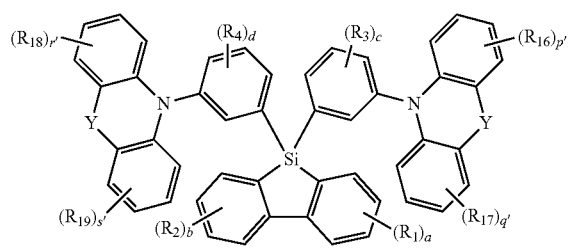

wherein, in Formula 4-1 and Formula 4-2,

Y is a direct linkage, $CR_{10}R_{11}$, O, S, $SiR_{12}R_{13}$, or $GeR_{14}R_{15}$, $R_{16}$ to $R_{19}$ are each independently a hydrogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, p to s are each independently an integer of 0 to 5, p' to s' are each independently an integer of 0 to 4, and $R_1$ to $R_4$ and a to d are the same as defined in Formula 1.

11. The organic electroluminescence device of claim 1, wherein the compound represented by Formula 1 is any one selected from among the compounds represented by Compound Group 1:
Compound Group 1
1
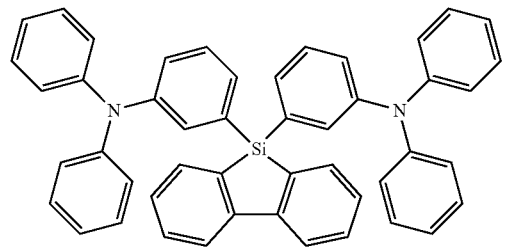
2
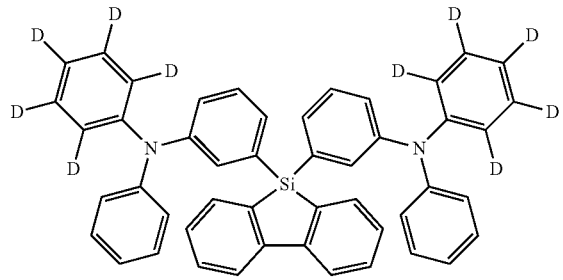
3
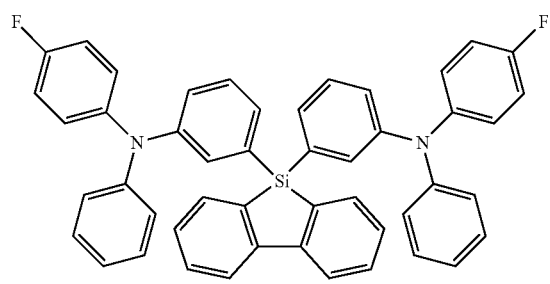
4
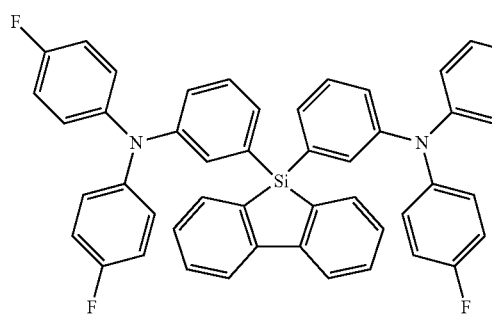
5
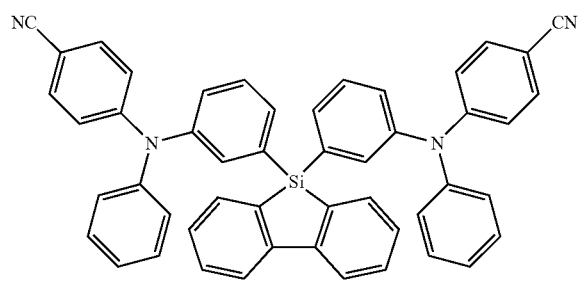
6
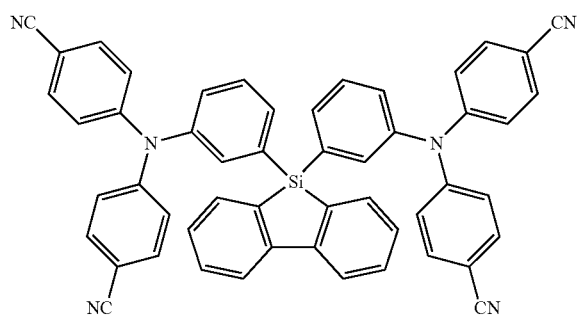
7
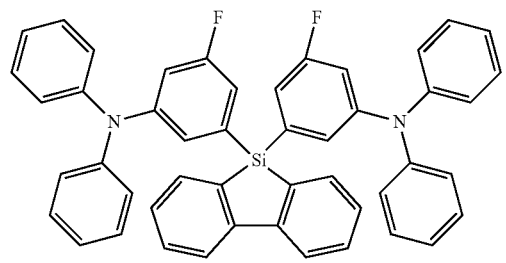
8
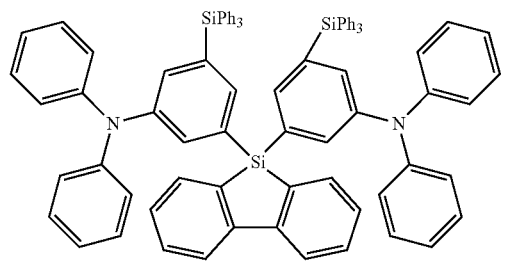
9
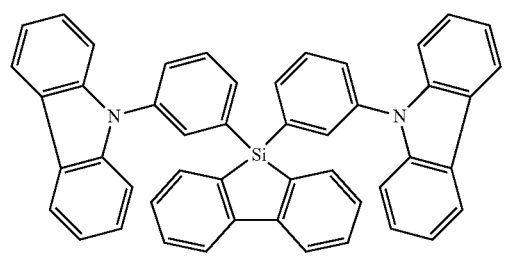
10
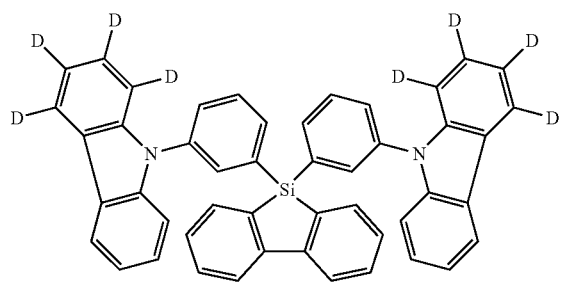

-continued
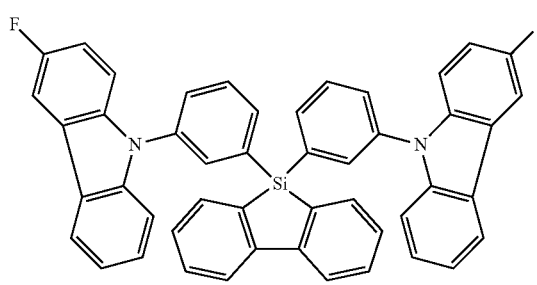
11
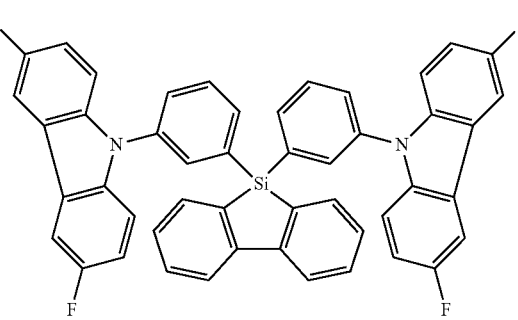
12
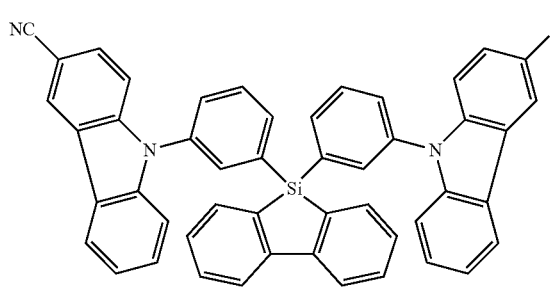
13
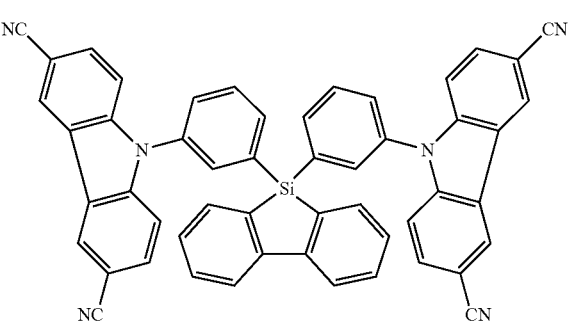
14
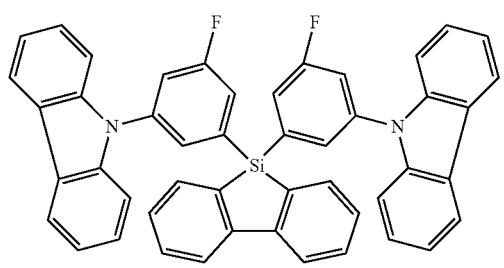
15
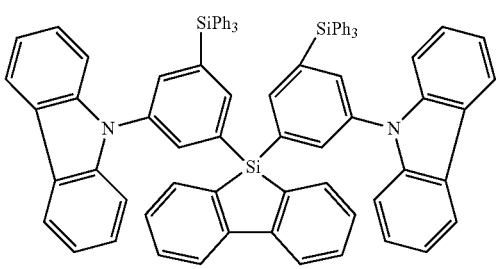
16
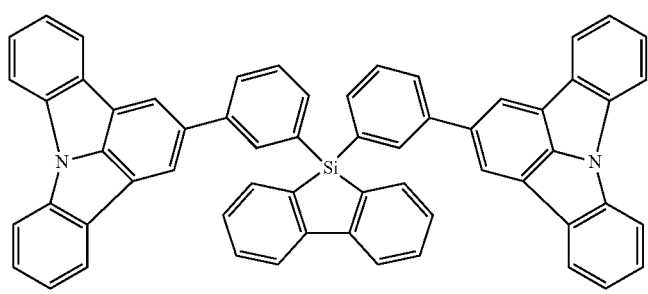
17
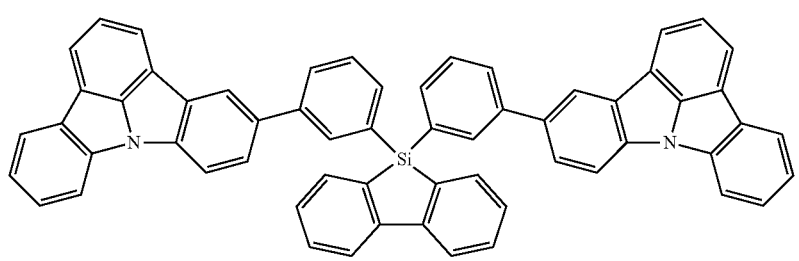
18

19

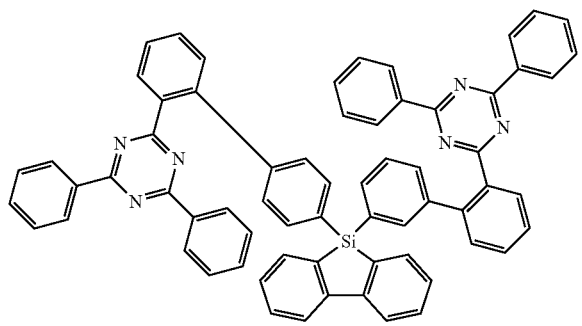

20

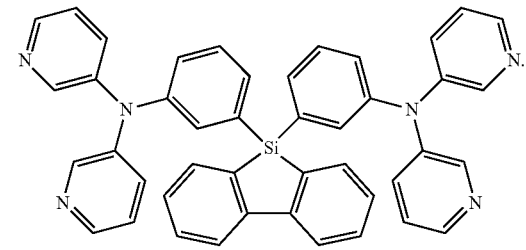

21

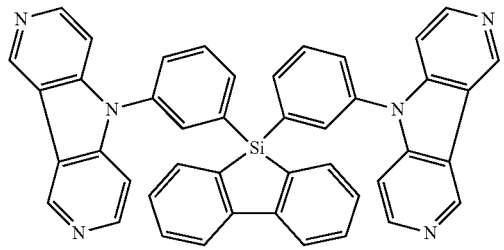

22

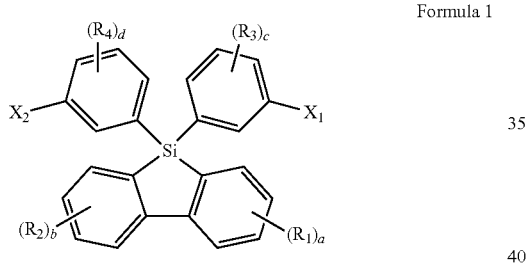

12. A polycyclic compound represented by Formula 1:

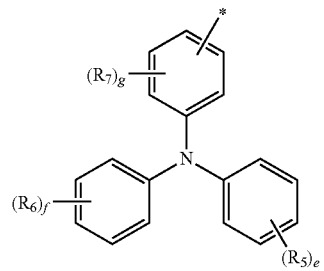

wherein, in Formula 1,
$R_1$ to $R_4$ are each independently a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and
a to d are each independently an integer of 0 to 4,
$X_1$ and $X_2$ are both 2,4,6-triphenyl-1,3,5-triazine or pyridine group, or
$X_1$ and $X_2$ are each independently represented by Formula 2 or Formula 3:

wherein, in Formula 2,
$Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, or are bonded to each other to form a ring, Formula 3 wherein, in Formula 3,
$R_5$ to $R_7$ are each independently a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to each other to form a ring,
e and f are each independently an integer of 0 to 5, and
g is an integer of 0 to 4.

13. The polycyclic compound of claim 12,
wherein Formula 2 is represented by Formula 2-1 or Formula 2-2 below:

Formula 2-1

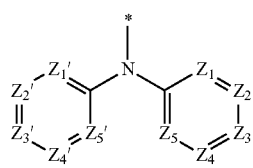

Formula 2-2

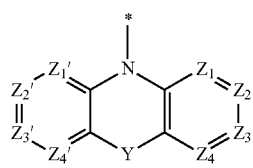

wherein, in Formula 2-1 and Formula 2-2,

Y is a direct linkage, $CR_{10}R_{11}$, O, S, $SiR_{12}R_{13}$, or $GeR_{14}R_{15}$, $R_{10}$ to $R_{15}$ are each independently a hydrogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $Z_1$ to $Z_5$ and $Z_1'$ to $Z_5'$ are each independently N or $CR_8$, $R_8$ is a hydrogen atom, a deuterium atom, a halogen atom, a substituted or unsubstituted thio group, a substituted or unsubstituted oxy group, a substituted or unsubstituted amine group, a substituted or unsubstituted alkyl group having 1 to 20 carbon atoms, a substituted or unsubstituted alkenyl group having 1 to 20 carbon atoms, a substituted or unsubstituted alkynyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

14. The polycyclic compound of claim 12, wherein Formula 3 is represented by Formula 3-1 or Formula 3-2 below:

Formula 3-1

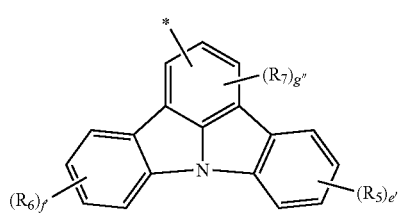

Formula 3-2

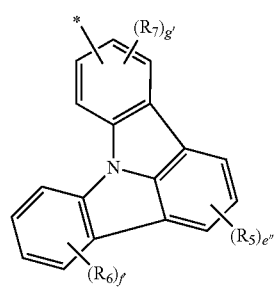

wherein, in Formula 3-1 and Formula 3-2,
e' and f' are each independently an integer of 0 to 4,
e" and g' are each independently an integer of 0 to 3, g" is an integer of 0 to 2, and $R_5$ to $R_7$ are the same as defined in Formula 3.

15. The polycyclic compound of claim 12, wherein Formula 1 is represented by Formula 4-1 or Formula 4-2:

Formula 4-1

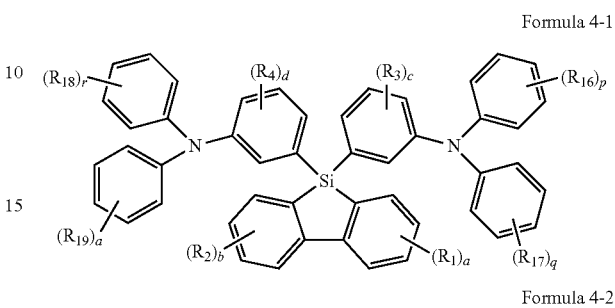

Formula 4-2

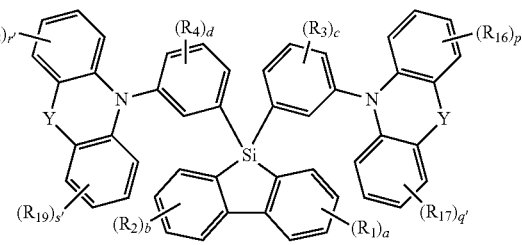

wherein, in Formula 4-1 and Formula 4-2,

Y is a direct linkage, $CR_{10}R_{11}$, O, S, $SiR_{12}R_{13}$, or $GeR_{14}R_{15}$, $R_{16}$ to $R_{19}$ are each independently a hydrogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, p to s are each independently an integer of 0 to 5, p' to s' are each independently an integer of 0 to 4, and $R_1$ to $R_4$ and a to d are the same as defined in Formula 1.

16. The polycyclic compound of claim 12,
wherein the compound represented by Formula 1 is any one among the compounds represented by Compound Group 1:

Compound Group 1

1